(12) United States Patent
Ding

(10) Patent No.: US 11,139,286 B2
(45) Date of Patent: Oct. 5, 2021

(54) SEMICONDUCTOR DEVICE INCLUDING A CAPACITOR STRUCTURE AND A THIN FILM RESISTOR AND A METHOD OF FABRICATING THE SAME

(71) Applicant: SAMSUNG ELECTRONICS CO., LTD., Suwon-si (KR)

(72) Inventor: Shaofeng Ding, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 70 days.

(21) Appl. No.: 16/569,481

(22) Filed: Sep. 12, 2019

(65) Prior Publication Data

US 2020/0235087 A1    Jul. 23, 2020

(30) Foreign Application Priority Data

Jan. 22, 2019   (KR) .................. 10-2019-0008140

(51) Int. Cl.
| | |
|---|---|
| H01L 23/52 | (2006.01) |
| H01L 23/64 | (2006.01) |
| H01L 27/01 | (2006.01) |
| H01L 49/02 | (2006.01) |
| H01L 23/522 | (2006.01) |

(52) U.S. Cl.
CPC .......... *H01L 27/01* (2013.01); *H01L 23/5226* (2013.01); *H01L 23/642* (2013.01); *H01L 23/647* (2013.01); *H01L 28/60* (2013.01)

(58) Field of Classification Search
CPC . H01L 23/5226; H01L 23/642; H01L 23/647; H01L 28/60; H01L 27/01; H01L 21/32131; H01L 28/24; H01L 23/5223

USPC .................. 257/379; 438/200, 210
See application file for complete search history.

(56) References Cited

U.S. PATENT DOCUMENTS

| | | |
|---|---|---|
| 6,500,724 B1 | 12/2002 | Zurcher et al. |
| 8,476,735 B2 | 7/2013 | Hsu et al. |
| 9,064,927 B2 | 6/2015 | Kageyama |
| 9,281,355 B2 | 3/2016 | Dirnecker |
| 9,391,016 B2 | 7/2016 | Shen et al. |
| 9,627,312 B2 | 4/2017 | Childs et al. |
| 2014/0103489 A1* | 4/2014 | Dirnecker ........... H01L 23/5223 257/532 |
| 2015/0108607 A1* | 4/2015 | Chen ................. H01L 28/24 257/533 |
| 2018/0226453 A1 | 8/2018 | Yi |
| 2020/0035779 A1* | 1/2020 | Huang ............. H01L 21/32131 |

\* cited by examiner

*Primary Examiner* — Didarul A Mazumder
(74) *Attorney, Agent, or Firm* — F. Chau & Associates, LLC

(57) ABSTRACT

According to an example embodiment of the present inventive concept, a semiconductor device includes a substrate. A first insulating layer is disposed on the substrate. A thin-film resistor is disposed in the first insulating layer. A capacitor structure is disposed on the first insulating layer and includes a first electrode pattern, a first dielectric pattern, a second electrode pattern, a second dielectric pattern and a third electrode pattern sequentially stacked. A first via is connected to the first electrode pattern and the third electrode pattern. A part of the first via is disposed in the first insulating layer. A second via is connected to the second electrode pattern, and a third via is connected to the thin-film resistor.

9 Claims, 24 Drawing Sheets

SEMICONDUCTOR DEVICE INCLUDING A CAPACITOR STRUCTURE AND A THIN FILM RESISTOR AND A METHOD OF FABRICATING THE SAME

CROSS-REFERENCE TO RELATED APPLICATION

This application claims priority under 35 U.S.C. § 119 to Korean Patent Application No. 10-2019-0008140 filed on Jan. 22, 2019 in the Korean Intellectual Property Office, the disclosure of which is incorporated by reference herein in its entirety.

TECHNICAL FIELD

The present disclosure relates to a semiconductor device and a method for fabricating the same, and more particularly, to a semiconductor device including a capacitor structure and a thin-film resistor, and a method for fabricating the same.

DISCUSSION OF RELATED ART

Semiconductor devices with greater integration and performance capabilities are increasingly in demand. Capacitors are commonly used in most semiconductor devices for proper circuitry functions, but capacitors occupy a relatively large footprint. As the degree of integration of semiconductor devices increases, it is desirable that the areas occupied by the capacitors are reduced while the capacitance of the capacitors is maintained or even increased.

In this regard, a metal-insulator-metal (MIM) capacitor has been developed, which uses a high-k material as its dielectric layer and which includes a metal material in its lower and upper electrodes.

SUMMARY

Aspects of the present disclosure provide for a semiconductor device including a thin-film resistor and a capacitor with increased capacitance.

Aspects of the present disclosure also provide a method for fabricating a semiconductor device including a thin-film resistor and a capacitor with increased capacitance.

According to an example embodiment of the present inventive concept, a semiconductor device is provided including a substrate. A first insulating layer is disposed on the substrate. A thin-film resistor is disposed in the first insulating layer. A capacitor structure is disposed on the first insulating layer and includes a first electrode pattern, a first dielectric pattern, a second electrode pattern, a second dielectric pattern and a third electrode pattern sequentially stacked. A first via is connected to the first electrode pattern and the third electrode pattern. A part of the first via is disposed in the first insulating layer. A second via is connected to the second electrode pattern, and a third via is connected to the thin-film resistor.

According to an example embodiment of the present inventive concept, a semiconductor device is provided including a substrate. A first conductive etch stop pattern and a second conductive etch stop pattern are disposed on the substrate at a same level and spaced apart from each other in a first direction. A capacitor structure is disposed above the first and second conductive etch stop patterns in a second direction and include a first electrode pattern, a first dielectric pattern, a second electrode pattern, a second dielectric pattern and a third electrode pattern sequentially stacked on one another in the second direction. A first via is disposed on the first conductive etch stop pattern and connected to the first conductive etch stop pattern, the first electrode pattern and the third electrode pattern. A second via is disposed on the second conductive etch stop pattern and connected to the second conductive etch stop pattern and the second electrode pattern.

According to an example embodiment of the present inventive concept, a semiconductor device is provided including a substrate. Conductive patterns are disposed on the substrate and include a first conductive etch stop pattern, a second conductive etch stop pattern and a thin-film resistor disposed at a same level and spaced apart from one another. A capacitor structure is disposed above the conductive patterns and includes a first electrode pattern and a second electrode pattern at least partially overlapping the first electrode pattern. A first via is disposed on the first conductive etch stop pattern and connected to the first conductive etch stop pattern and the first electrode pattern. A second via is disposed on the second conductive etch stop pattern and connected to the second conductive etch stop pattern and the second electrode pattern. A third via is connected to the thin-film resistor.

BRIEF DESCRIPTION OF THE FIGURES

The above and other aspects and features of the present disclosure will be more clearly understood from the following detailed description taken in conjunction with the accompanying drawings, in which.

DETAILED DESCRIPTION OF THE EMBODIMENTS

Figure 1:
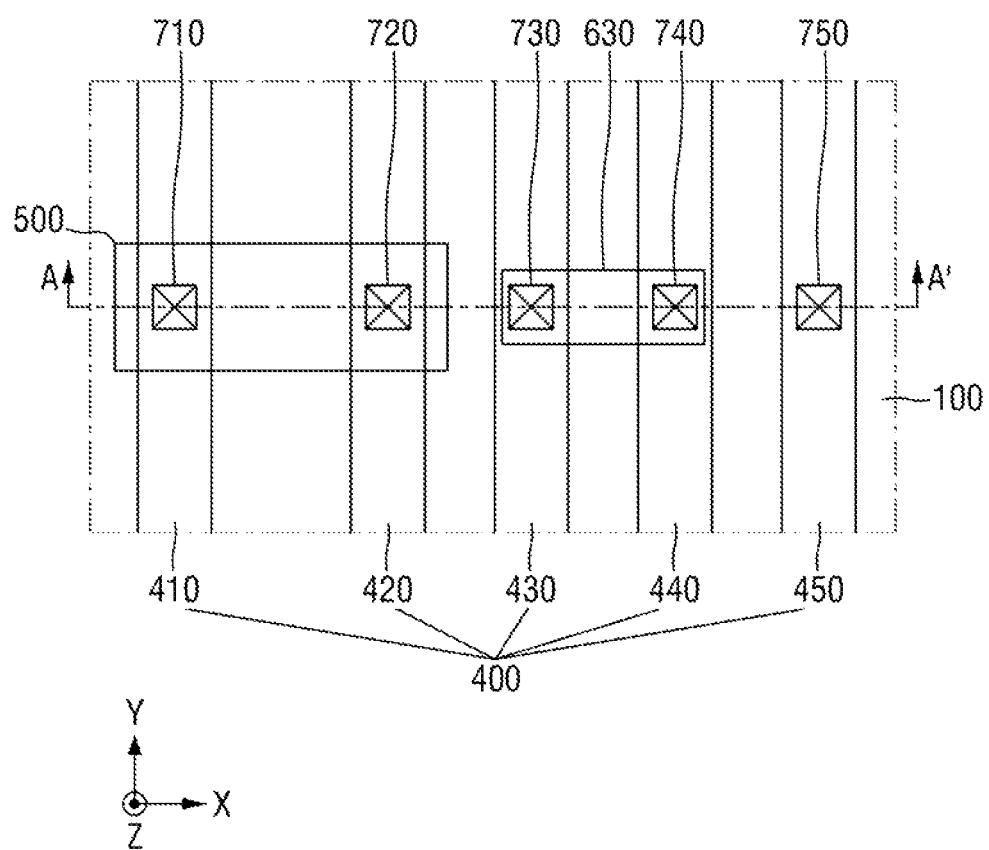
FIG. 1 is a plan view illustrating a layout of a semiconductor device according to an example embodiment of the present inventive concept.
Figure 2:
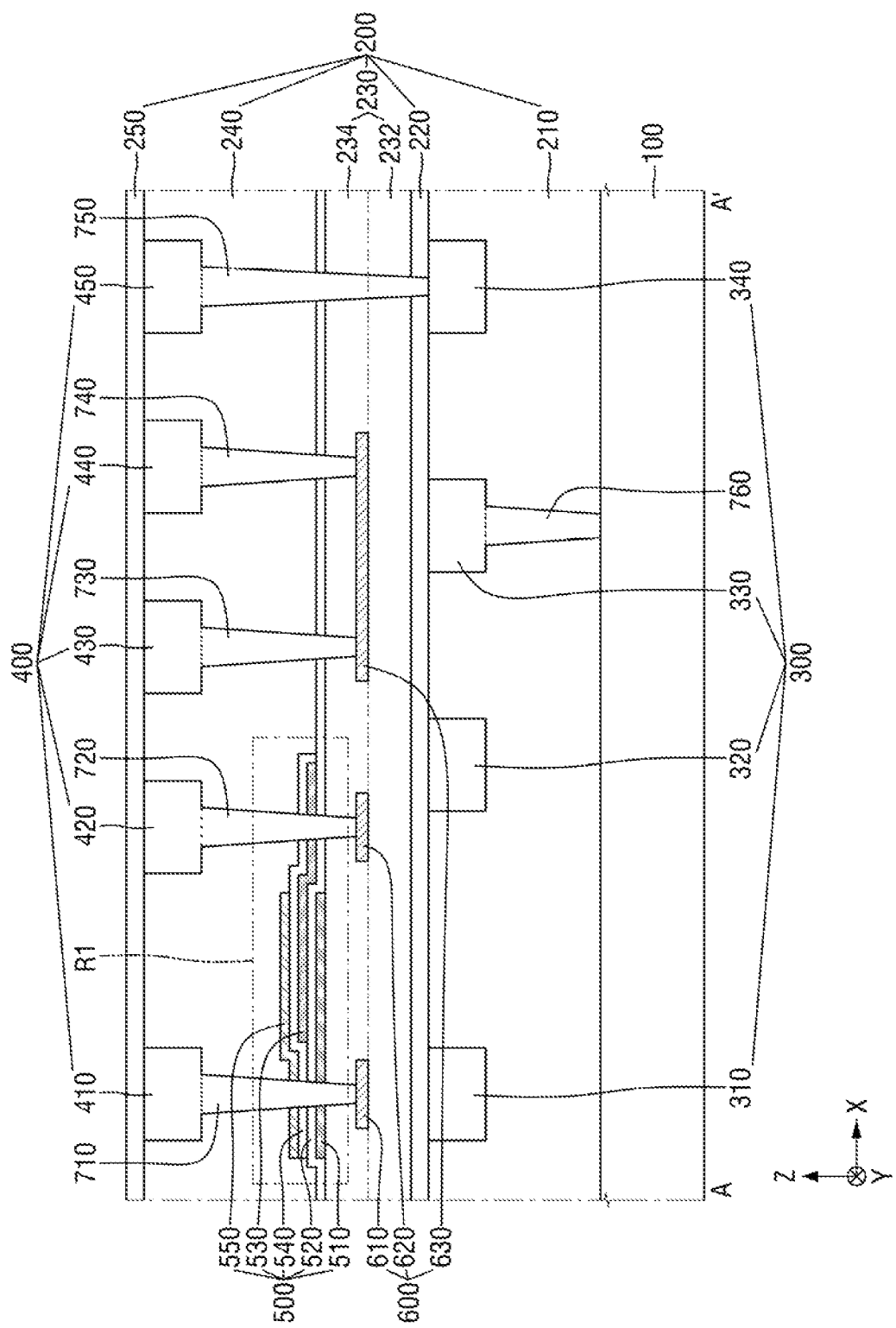
FIG. 2 is a cross-sectional view taken along line A-A' of FIG. 1.
Figure 3:
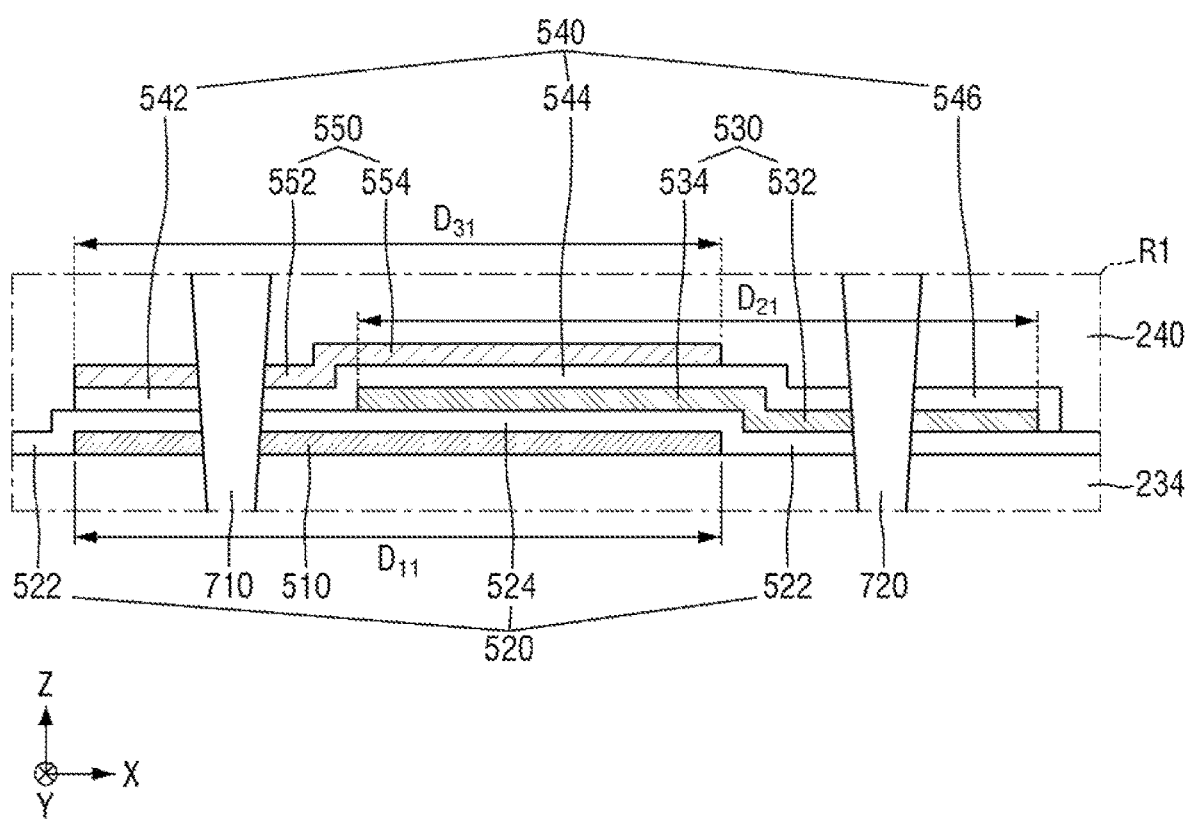
FIG. 3 is an enlarged cross-sectional view illustrating region R1 of FIG. 2.

Hereinafter, a semiconductor device according to example embodiments of the present disclosure will be described with reference to FIGS. 1 to 10. FIG. 1 is a plan view illustrating a layout of a semiconductor device according to an example embodiment of the present inventive concept. FIG. 2 is a cross-sectional view taken along line A-A' of FIG. 1. FIG. 3 is all enlarged view illustrating region R1 of FIG. 2.

Referring to FIGS. 1 to 3, a semiconductor device according to an example embodiment of the present inventive concept may include a substrate 100, an insulating structure 200, a lower line structure 300, an upper line structure 400, a capacitor structure 500, conductive patterns 600, and a plurality of vias. For example, the plurality of vias may comprise first to sixth vias 710, 720, 730, 740, 750 and 760.

A substrate 100 may be a bulk silicon substrate or a SOI (silicon-on-insulator) substrate. Alternatively, the substrate 100 may be a silicon substrate or may be a substrate including silicon germanium (SiGe), silicon germanium on insulator (SGOI), indium antimonide (InSb), lead-telluride (PbTe) compound, indium arsenide (InAs), indium phosphide (InP), gallium arsenide (GaAs), and/or antimonide (GaSb).

The substrate 100 may include a variety of internal circuit patterns disposed therein. The internal circuit patterns may include, for example, a transistor, a diode, and/or a capacitor.

The insulating structure 200 may be formed on the substrate 100. The insulating structure 200 may include a plurality of insulating layers 210, 220, 230, 240 and 250. For example, the insulating structure 200 may include first to fifth insulating layers 210, 220, 230, 240 and 250 stacked on the substrate 100 sequentially.

In an example embodiment of the present inventive concept, at least one of the plurality of insulating layers 210, 220, 230, 240 and 250 may be used as a capping layer. For example, the second and fifth insulating layers 220 and 250 may be capping layers.

Although the insulating structure 200 is illustrated as including only five insulating layers 210, 220, 230, 240 and 250, this is merely for convenience of illustration. The insulating structure 200 may also include a number of insulating layers fewer than or greater than five insulating layers.

Although clearly delineated boundaries may be formed between the first to fifth insulating layers 210, 220, 230, 240 and 250 in the drawings, this is merely illustrative. It is to be understood that the present inventive concept is not limited thereto. For example, depending on the process of forming the insulating structure 200, a boundary might not be formed between at least two of the plurality of insulating layers 210, 220, 230, 240 and 250.

The first insulating layer 210 may include an upper and a lower surface spaced apart in a third direction (e.g., the Z direction). The lower surface of the first insulating layer may be formed on an upper surface of the substrate 100. The upper surface of the first insulating layer 210 may overlap a lower surface of the second insulating layer 220 in at least one direction (e.g., a Z direction). The first insulating layer 210 may include the lower line structure 300 and the sixth via 760 disposed therein. Although the first insulating layer 210 is shown as directly disposed on the upper surface of the substrate 100, the present disclosure is not limited thereto. For example, one or more intervening layers may be formed between the lower surface of the first insulating layer 210 and the substrate 100.

The second insulating layer 220 may include an upper and a lower surface spaced apart in a third direction (e.g., the Z direction). The second insulating layer 220 may be disposed between the first insulating layer 210 and the third insulating layer 230. The lower surface of the second insulating layer 220 may extend in parallel to a plane of the upper surface of the first insulating layer 210, and may overlap an upper surface of the lower line structure 300. For example, the lower surface of the second insulating layer 220 may overlap an upper surface of the first insulating layer 210 in at least one direction (e.g., the Z direction). The upper surface of the second insulating layer 220 may overlap a lower surface of the third insulating layer 230 in at least one direction (e.g., the Z direction).

The second insulating layer 220 may include an upper and a lower surface spaced apart in a third direction (e.g., the Z direction) and may be used as a capping layer. For example, a part of the second insulating layer 220 may be removed so that a part of the lower line structure 300 (for example, a part of a fourth lower line pattern 340) may be exposed therethrough. A part of the lower line structure 300 may connect to the upper line structure 400, for example, through the fifth via 750 passing through the second and third insulating layers 220 and 230 in the third direction (e.g., the Z direction).

The third insulating layer 230 may include an upper and a lower surface spaced apart in a third direction (e.g., the Z direction). The lower surface of the third insulating layer 230 may be formed on the upper surface of the second insulating layer 220. For example, the third insulating layer 230 may overlap an upper surface of the second insulating layer 220 in at least one direction (e.g., the Z direction). The third insulating layer 230 may include conductive patterns 600 disposed therein. A capacitor structure 500 may be formed on the upper surface of the third insulating layer 230. The third insulating layer 230 may include a lower insulating layer 232 and an upper insulating layer 234.

The fourth insulating layer 240 may include an upper and a lower surface spaced apart in a third direction (e.g., the Z direction), and may be disposed on the third insulating layer 230. For example, the lower surface of the fourth insulating layer 240 may at least partially overlap the upper surface of the third insulating layer 230 and an upper surface of the capacitor structure 500 in at least one direction (e.g., the Z direction). A first dielectric pattern 520 may be disposed on at least a portion of the upper surface of the third insulating layer 230 and the lower surface of the fourth insulating layer 240. Although the fourth insulating layer 240 is shown as separated from the third insulating layer 230 by a first dielectric pattern 520 in FIG. 2, the present inventive concept is not limited thereto. For example, the first dielectric pattern 520 may be formed on only a part of the upper surface of the third insulating layer 230, and a part of the fourth insulating layer 240 may be formed on the upper surface of the third insulating layer 230 that is not overlapped by the first dielectric pattern 520.

The fifth insulating layer 250 may include an upper and a lower surface spaced apart in a third direction (e.g., the Z direction). The fifth insulating layer 250 may be formed on the upper surface of the fourth insulating layer 240 and an upper surface of the upper line structure 400, overlapping in at least one direction. For example, the lower surface of the fifth insulating layer 250 may extend along the upper surface of the fourth insulating layer 240 and the upper surface of the upper line structure 400 in at least one direction (e.g., the X direction and/or the Y direction). The fifth insulating layer 250 may be used as a capping layer, as mentioned above. For example, a part of the fifth insulating layer 250 may be removed so that a part (e.g., an upper surface) of the upper line structure 400 may be exposed therethrough.

The insulating structure 200 may include silicon dioxide ($SiO_2$), silicon nitride ($Si_xN_y$), silicon oxynitride ($Si_xON_y$), and/or a low-k material having a lower dielectric constant than SiO$_2$. The low-k material may include, but is not limited to, flowable oxide (FOX), tonen silazane (TOSZ), undoped silicate glass (USG), borosilicate glass (BSG), phosphosilicate glass (PSG), borophosphosilica glass (BPSG), plasma enhanced tetraethylorthosilicate (PE-TEOS), fluoride silicate glass (FSG), carbon doped silicon oxide (CDO), xerogel, aerogel, amorphous fluorinated carbon, organosilicate glass (OSG), parylene, bis-benzocyclobutenes (BCB), SiLK, polyimide (PI), and/or a porous polymeric material.

As mentioned above, according to example embodiments of the present inventive concept, the second insulating layer 220 and/or the fifth insulating layer 250 may be a capping layer. In such case, the second insulating layer 220 and/or the fifth insulating layer 250 may include silicon nitride (Si$_x$N$_y$). However, the present inventive concept is not limited thereto.

The lower line structure 300 and the upper line structure 400 may be formed in the insulating structure 200. For example, the lower line structure 300 may be formed in the first insulating layer 210 and the upper line structure 400 may be formed in the fourth insulating layer 240.

The lower line structure 300 may include a plurality of patterns spaced apart from each other in the first direction (e.g., the X direction). For example, the lower line structure 300 may include a first lower line pattern 310, a second lower line pattern 320, a third lower line pattern 330, and a fourth lower line pattern 340. The lower line patterns 310, 320, 330, and 340 of the lower line structure 300 may include, for example, conductive wires.

Although the lower line structure 300 is shown as including only four lower line patterns 310, 320, 330 and 340, this is merely illustrative. It is to be understood that the present inventive concept is not limited thereto.

The lower line structure 300 may extend in the second direction (e.g., the Y direction) which may be substantially orthogonal to the first direction (e.g., the X direction). The lower line patterns 310, 320, 330 and 340 of the lower line structure 300 may be spaced apart from one another in the first direction (e.g., the X direction).

The upper line structure 400 may include a plurality of line patterns spaced apart from one another in the first direction (e.g., the X direction). For example, the upper line structure 400 may include a first upper line pattern 410, a second upper line pattern 420, a third upper line pattern 430, a fourth upper line pattern 440, and a fifth upper line pattern 450. The upper line patterns 410, 420, 430, 440 and 450 may include, for example, conductive wires.

Although the upper line structure 400 is shown as including only five lower line patterns 410, 420, 430, 440 and 450, this is merely illustrative. It is to be understood that the present inventive concept is not limited thereto.

The upper line structure 400 may extend in a second direction (e.g., the Y direction) which may be substantially orthogonal to the first direction (e.g., the X direction). The upper line patterns 410, 420, 430 and 440 of the upper line structure 400 may be spaced apart from one another in the first direction (e.g., the X direction).

Although the upper line patterns 410, 420, 430, 440 and 450 of the upper line structure 400 are shown as not connected to one another, this is merely illustrative. For example, the second upper line pattern 420 may connect to the third upper line pattern 430 through an additional line. Further, the second upper line pattern 420 may connect to the fifth upper line pattern 450 through an additional line. Further, the fourth upper line pattern 440 may connect to the fifth upper line pattern 450 through an additional line.

The plurality of vias 710, 720, 730, 740, 750 and 760 may be formed in the insulating structure 200. For example, the first to fourth vias 710, 720, 730 and 740 may be formed in the third insulating layer 230 (e.g., the upper insulating layer 234) and fourth insulating layer 240. The fifth via 750 may be formed in the second to fourth insulation layers 220, 230 and 240. The sixth via 760 may be formed in the first insulating layer 210. For example, the sixth via 760 may be disposed between the substrate 100 and the third lower line pattern 330.

The plurality of vias 710, 720, 730, 740, 750 and 760 may extend substantially in a third direction (e.g., a Z direction).

The first via 710 may extend in the third direction (e.g., the Z direction) through the capacitor structure 500 and at least a portion of the upper insulating layer 234. The first upper line pattern 410 may connect to the capacitor structure 500 and a first etch stop pattern 610 through the first via 710.

The second via 720 may extend in the third direction (e.g., the Z direction) through the capacitor structure 500 and at least a portion of the upper insulating layer 234. The second upper line pattern 420 may connect to the capacitor structure 500 and a second etch stop pattern 620 through the second via 720.

The third via 730 may extend in the third direction (e.g., the Z direction). The third upper line pattern 430 may connect to a thin-film resistor 630 through the third via 730.

The fourth via 740 may extend in the third direction (e.g., the Z direction). The fourth upper line pattern 440 may connect to the thin-film resistor 630 through the fourth via 740.

The fifth via 750 may extend in the third direction (e.g., the Z direction). The fifth upper line pattern 450 may connect to the fourth lower line pattern 340 of the lower line structure 300 through the fifth via 750.

The sixth via 760 may extend in the third direction (e.g., the Z direction). The third lower line pattern 330 may connect to the substrate 100 through the sixth via 760.

Although the first and second lower line patterns 310 and 320 of the lower line structure 300 are shown as not connected to the vias, this is merely illustrative. It shall be understood that the present inventive concept is not limited thereto.

Each of the plurality of vias 710, 720, 730, 740, 750, and 760 may have tapered sidewalls. For example, the width of each of the plurality of vias 710, 720, 730, 740, 750 and 760 may increase in a third direction (e.g., the Z direction) away from the upper surface of the substrate 100. As used herein, the term width may refer to a width in the first direction (e.g., the X direction) parallel to a plane of the upper surface of the substrate 100. Such shape may be formed during an etching process for forming the plurality of vias 710, 720, 730, 740, 750 and 760. It is, however, to be understood that the present inventive concept is not limited thereto, and the sidewalls of the plurality of vias 710, 720, 730, 740, 750 and 760 may be formed to include various shapes.

Although the cross section of each of the plurality of line patterns 310, 320, 330, 340, 410, 420, 430, 440 and 450 is shown as a rectangular shape, the present inventive concept is not limited thereto.

For example, the sidewalls of each of the plurality of line patterns 310, 320, 330, 340, 410, 420, 430, 440 and 450 may have a tapered shape. For example, the sidewalls of each of the plurality of line patterns 310, 320, 330, 340, 410, 420, 430, 440 and 450 may increase in a third direction (e.g., the Z direction) away from the upper surface of the substrate 100. However, the shape of the sidewalls of each of the plurality of line patterns 310, 320, 330, 340, 410, 420, 430, 440 and 450 is not limited thereto. The plurality of line patterns 310, 320, 330, 340, 410, 420, 430, 440 and 450 may have a variety of shapes.

The plurality of line patterns 310, 320, 330, 340, 410, 420, 430, 440 and 450 and the plurality of vias 710, 720, 730, 740, 750 and 760 may include a metal such as tungsten (W) titanium (Ti), tantalum (Ta), copper (Cu) and aluminum (Al), and/or a metal nitride (e.g., titanium nitride (TiN), tantalum nitride (TaN) and/or tungsten nitride (WN)).

The capacitor structure 500 may be formed on the upper surface of the third insulating layer 230 (e.g., the upper insulating layer 234). The capacitor structure 500 may extend along the upper surface of the third insulating layer 230 in at least one direction (e.g., the X direction and/or the Y direction). The capacitor structure 500 may be formed in the fourth insulating layer 240. The capacitor structure 500 may be formed between the upper surface of the third insulating layer 230 and a portion of the lower surface of the fourth insulating layer 240.

The capacitor structure 400 may include a first electrode pattern 510, a first dielectric pattern 520, a second electrode pattern 530, a second dielectric pattern 540 and a third electrode pattern 550 sequentially stacked on the third insulating layer 230.

The capacitor structure 500 may extend in the first direction (e.g., the X direction). For example, the capacitor structure 500 may extend in the first direction (e.g., the X direction) between the first upper line pattern 410 and the second upper line pattern 420.

In FIG. 3, a length D11 of the first electrode pattern 510 in the first direction (e.g., the X direction) may be substantially the same as a length D21 of the second electrode pattern 530 the first direction (e.g., the X direction). In addition, the length D11 of the first electrode pattern 510 in the first direction (e.g., the X direction) may be substantially equal to a length D31 of the third electrode pattern 550 in the first direction (e.g., the X direction). However, it shall be understood that this is merely illustrative and the present inventive concept is not limited thereto.

The first electrode pattern 510 may include an upper and lower surface spaced in a third direction (e.g., the Z direction) and a first and second end part spaced apart in the first direction (e.g., the X direction). The first electrode pattern 510 may extend along the upper surface of the third insulating layer 230 (e.g., the upper insulating layer 234). The first electrode pattern 510 may be electrically connected to the first via 710. In addition, the first electrode pattern 510 might not be electrically connected to the second via 720.

The first dielectric pattern 520 may include an upper and lower surface spaced in a third direction (e.g., the Z direction). The first dielectric pattern 520 may extend along the upper surface of the first electrode pattern 510 and the upper surface of the third insulating layer 230. The first dielectric pattern 520 may cover the upper surface and sidewalls of the first electrode pattern 510. For example, the first dielectric pattern 520 may cover the first and second end parts of the first electrode pattern 510 and a remainder of the upper surface of the third insulating layer 230 (e.g., the upper insulating layer 234) that is not overlapped by the first electrode pattern 510. Although the first dielectric pattern 520 is shown as extended along substantially the entire upper surface of the third insulating layer 230, the present inventive concept is not limited thereto.

As shown in FIG. 3, the first dielectric pattern 520 may include a first portion 522 extended in the first direction (e.g., the X direction) along the upper surface of the third insulating layer 230 (e.g., the upper insulating layer 234) and a second portion 524 extended in the first direction (e.g., the X direction) along the upper surface of the first electrode pattern 510. The first portion 522 of the first dielectric pattern 520 may have a first segment and a second segment spaced apart in the first direction (e.g., the X direction). The first and second segments of the first portion 522 of the first dielectric pattern 520 may each have first and second end parts. First and second end parts described hereafter, in relation to the cross sections shown, may refer to a relative sequence encountered in the first direction (e.g., the X direction) proceeding from left to right within each described element.

The second end part of the first segment of the first portion 522 may overlap the first end part of the second portion 524 of the first dielectric pattern 520 in the third direction (e.g., the Z direction). The first end part of the second segment of the first portion 522 may overlap the second end part of the second portion 524 of the first dielectric pattern 520 in the third direction (e.g., the Z direction).

The second electrode pattern 530 may at least partially cover the upper surface of the first dielectric pattern 520, including the second segment of the first portion 522 and the second portion 524. For example, the second electrode pattern 530 may include a first portion 532 extended in the first direction (e.g., the X direction) along an upper surface of the second segment of the first portion 522 of the first dielectric pattern 520, and a second portion 534 extended in the first direction (e.g., the X direction) at least partially covering the upper surface of the second portion 524 of the first dielectric pattern 520. Each of the first and second portions 532 and 534 of the second electrode pattern 530 may include an upper and lower surface spaced in the third direction (e.g., the Z direction) and first and second end parts spaced in the first direction (e.g., the X direction). The first end part of the first portion 532 of the second electrode pattern 530 may overlap the second end part of the second portion 534 of the second electrode pattern 530 in the third direction (e.g., the Z direction). The lower surface of the second portion 534 of the second electrode pattern 530 may cover the upper surface of the first electrode pattern 510 and the upper surface of the second portion 524 of the first dielectric pattern 520, including respective second end parts, in the third direction (e.g., the Z direction).

The second electrode pattern 530 may be electrically connected to the second via 720. Also, the second electrode pattern 530 might not be electrically connected to the first via 710.

The second dielectric pattern 540 may include an upper and a lower surface spaced in the third direction (e.g., the Z direction) and may extend along the upper surface of the first dielectric pattern 520 and an upper surface of the second electrode pattern 530. The second dielectric pattern 540 may cover the upper surface and sidewalk, of the second electrode pattern 530. For example, the second dielectric pattern 540 may include a first portion 542 extended along the upper surface of the second portion 524 of the first dielectric pattern 520 in the first direction (e.g., the X direction), a second portion 544 extended along the upper surface of the second portion 534 of the second electrode pattern 530, and a third portion 546 extended along the upper surface and sidewall of the first portion 532 of the second electrode pattern 530. Each of the first portion 542, the second portion 544, and the third portion 546 of the second dielectric layer may include a first and a second end part.

The second end pan of the first portion 542 of the second dielectric pattern 540 may cover a side surface of the second portion 534 of the second electrode pattern 530 in the first direction (e.g., the X direction). The second portion 544 of the second dielectric pattern 540 may cover the upper surface of the second portion 534 of the second electrode pattern 530. For example, the second portion 544 of the second dielectric pattern 540 may cover both the first end part and the second end part of the second portion 534 in the third direction (e.g., the Z direction). In addition, the third portion 546 of the second dielectric pattern 540 may cover the side surface of the second portion 534 of the second electrode pattern 530. For example, the second end part of the third portion 546 may have a perpendicular portion that extends in the third direction (e.g., the Z direction) to contact an upper surface of the second segment of the first portion 522 of the first dielectric layer 520. The perpendicular portion of the second end part of the third portion 546 extending in the third direction (e.g., the Z direction) may have a sidewall that overlaps an adjacent side surface of a second end part of the first portion 532 of the second electrode pattern 530 in the first direction (e.g., the X direction).

In addition, the second end part of the first portion 542 of the second dielectric pattern 540 may overlap the first end part of the second portion 544 of the second dielectric pattern 540. The second end part of the second portion 544 of the second dielectric pattern 540 may overlap the first end part of the third portion 546 of the second dielectric pattern 540.

The third electrode pattern 550 may have an upper and lower surface spaced in the third direction (e.g., the Z direction) and may extend along the upper surface of the second dielectric pattern 540. The third electrode pattern 550 may cover a part of the upper surface of the second dielectric pattern 540. For example, the third electrode pattern 550 may include a first portion 552 extended along the upper surface of the first portion 542 of the second dielectric pattern 540, and a second portion 554 extended along the upper surface of the second portion 544 of the second dielectric pattern 540. For example, the second portion 554 may only partially cover the upper surface of the second portion 544 of the second dielectric pattern 540.

A second end part of the first portion 552 of the third electrode pattern 550 may partially overlap the first end part of the second portion 554 of the third electrode pattern 550. The second portion 554 of the third electrode pattern 550 may at least partially overlap the underlying second portion 534 of the second electrode pattern 530 in the third direction (e.g., the Z direction).

The third electrode pattern 550 may be electrically connected to the first via 710. In addition, the third electrode pattern 550 may not be electrically connected to the second via 720.

The first electrode pattern 510, the second electrode pattern 530 and the third electrode pattern 550 may include Ti, TiN, Ta, TaN, WN, and/or a metal silicide. The first to third electrode patterns 510, 530 and 550 may include either the same material or different materials.

The first dielectric pattern 520 and the second dielectric pattern 540 may include $SiO_2$, $Si_xN_y$, $Si_xON_y$, and/or a high-k material having a higher dielectric constant than $SiO_2$. For example, the high-k material may include hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The conductive patterns 600 may be formed in the third insulating layer 230. For example, the conductive patterns 600 may be formed on an upper surface of the lower insulating layer 232. The conductive patterns 600 may be covered by a lower surface of the upper insulating layer 234.

The conductive patterns 600 may include a first etch stop pattern 610, a second etch stop pattern 620, and a thin-film resistor 630. Although the conductive patterns 600 are shown as including two etch stop patterns 610 and 620 and the single thin-film resistor 630, the present inventive concept is not limited thereto.

The conductive patterns 600 may extend in the first direction (e.g., the X direction). The first etch stop pattern 610, the second etch stop pattern 620 and the thin-film resistor 630 may be spaced apart from one another in the first direction (e.g., the X direction).

The thin-film resistor 630 may extend in the first direction (e.g., the X direction). For example, the thin-film resistor 630 may extend in the first direction (e.g., the X direction) between the third upper line pattern 430 and the fourth upper line pattern 440.

The first etch stop pattern 610, the second etch stop pattern 620 and the thin-film resistor 630 may be formed at the same level. As used herein, the level may refer to a layer that is spaced from the upper surface of the substrate 100 by a certain distance in the third direction (e.g., the Z direction) and is parallel to a plane of the upper surface of the substrate 100.

For example, the first etch stop pattern 610, the second etch stop pattern 620 and the thin-film resistor 630 may be equally spaced apart from the upper surface of the substrate 100 in the third direction (e.g., the Z direction). As used herein, when elements are referred to as being equally spaced apart from the substrate 100, they may be exactly or substantially equally spaced apart from the substrate 100 within appropriate manufacturing tolerances.

Although the first etch stop pattern 610, the second etch stop pattern 620 and the thin-film resistor 630 are shown as being formed at the same level in FIG. 2, the present inventive concept is not limited thereto. For example, the upper surface of the lower insulating layer 232 may have first and second structures of different heights in the third direction (e.g., the Z direction). The first etch stop pattern 610 may be formed on the first structure, and the second etch stop pattern 620 may be formed on the second structure. The second etch stop pattern 620 may be formed on the first structure, and the thin-film resistor 630 may be formed on the second structure.

The first etch stop pattern 610, the second etch stop pattern 620 and the thin-film resistor 630 may be spaced apart from one another in the first direction (e.g., the X direction). For example, the first etch stop pattern 610, the second etch stop pattern 620 and the thin-film resistor 630 may be electrically separated from one another.

The first etch stop pattern 610 may connect to the first via 710. The first via 710 may penetrate the upper insulating layer 234 and may be electrically connected to the first etch stop pattern 610. The first etch stop pattern 610 may connect to the capacitor structure 500 through the first via 710.

The first via 710 may be formed on the upper surface of the first etch stop pattern 610. The first via 710 might not penetrate the first etch stop pattern 610. For example, the first via 710 might not be formed on the lower surface of the first etch stop pattern 610. That is to say, the first via 710 might not extend to the lower insulating layer 232.

The second etch stop pattern 620 may connect to the second via 720. The second via 720 may penetrate the upper insulating layer 234 and may be electrically connected to the second etch stop pattern 620. The second etch stop pattern 620 may connect to the capacitor structure 500 through the second via 720.

The second via 720 may be firmed on the upper surface of the second etch stop pattern 620. The second via 720 might not penetrate the second etch stop pattern 620. For example, the second via 720 might not be formed on the lower surface of the second etch stop pattern 620. That is to say, the second via 720 might not extend to the lower insulating layer 232.

The thin-film resistor 630 may connect to the third and fourth vias 730 and 740. The third and fourth vias 740 may penetrate the upper insulating layer 234 and be electrically connected to the thin-film resistor 630. The third via 730 may be electrically connected to the fourth via 740 through the thin-film resistor 630.

The resistance of the thin-film resistor 630 may be defined based on the distance between the third via 730 and the fourth via 740, the thickness of the thin-film resistor 630, and the area of the thin-film resistor 630. The thickness of the thin-film resistor 630 may be defined as the length in the third direction (e.g., the Z direction) perpendicular to the plane of the upper-surface of the substrate 100. In addition, the area of the thin-film resistor 630 may be defined as the area of the surface parallel to the upper surface of the substrate 100. For example, the area may refer to a plane defined in the first direction (e.g., the X direction) and the second direction (e.g., the Y direction).

For example, the resistance of the thin-film resistor 630 may be proportional to the distance between the third via 730 and the fourth via 740. The resistance of the thin-film resistor 630 may be inversely proportional to the thickness and the area of the thin-film resistor 630.

The third and fourth vias 730 and 740 may be formed on the upper surface of the thin-film resistor 630. The third and fourth vias 740 might not penetrate the thin-film resistor 630. For example, the third and fourth vias 740 might not be formed on the lower surface of the thin-film resistor 630. That is to say, the third via 730 and the fourth via 740 might not extend to the lower insulating layer 232.

A lower surface of the first to fourth vias 710, 720, 730 and 740 may be spaced apart from the lower line structure 300. The lower insulating layer 232 may be formed between the first to fourth vias 710, 720, 730 and 740 and the lower line structure 300. Accordingly, the first to fourth vias 710, 720, 730 and 740 might not be electrically connected to the lower line structure 300.

The conductive patterns 600 may include Ti, TiN, Ta, TaN, WN, and/or metal silicide. The first etch stop pattern 610, the second etch stop pattern 620 and the thin-film resistor 630 may include the same material or different materials.

Although the conductive patterns 600 are shown as including only the first etch stop pattern 610, the second etch stop pattern 620 and the thin-film resistor 630 in FIG. 2, the present inventive concept is not limited thereto. For example, the conductive patterns 600 may further include one or more etch stop patterns or thin-film resistors.

In addition, although the thin-film resistor 630 is shown as being disposed next to the first etch stop pattern 610 and the second etch stop pattern 620 in FIG. 2, the present inventive concept is not limited thereto. For example, the thin-film resistor 630 may be spaced apart from the first etch stop pattern 610 and the second etch stop pattern 620. In other words, one or more vias may be formed between the second via 720 and the third via 730.

Figure 4:
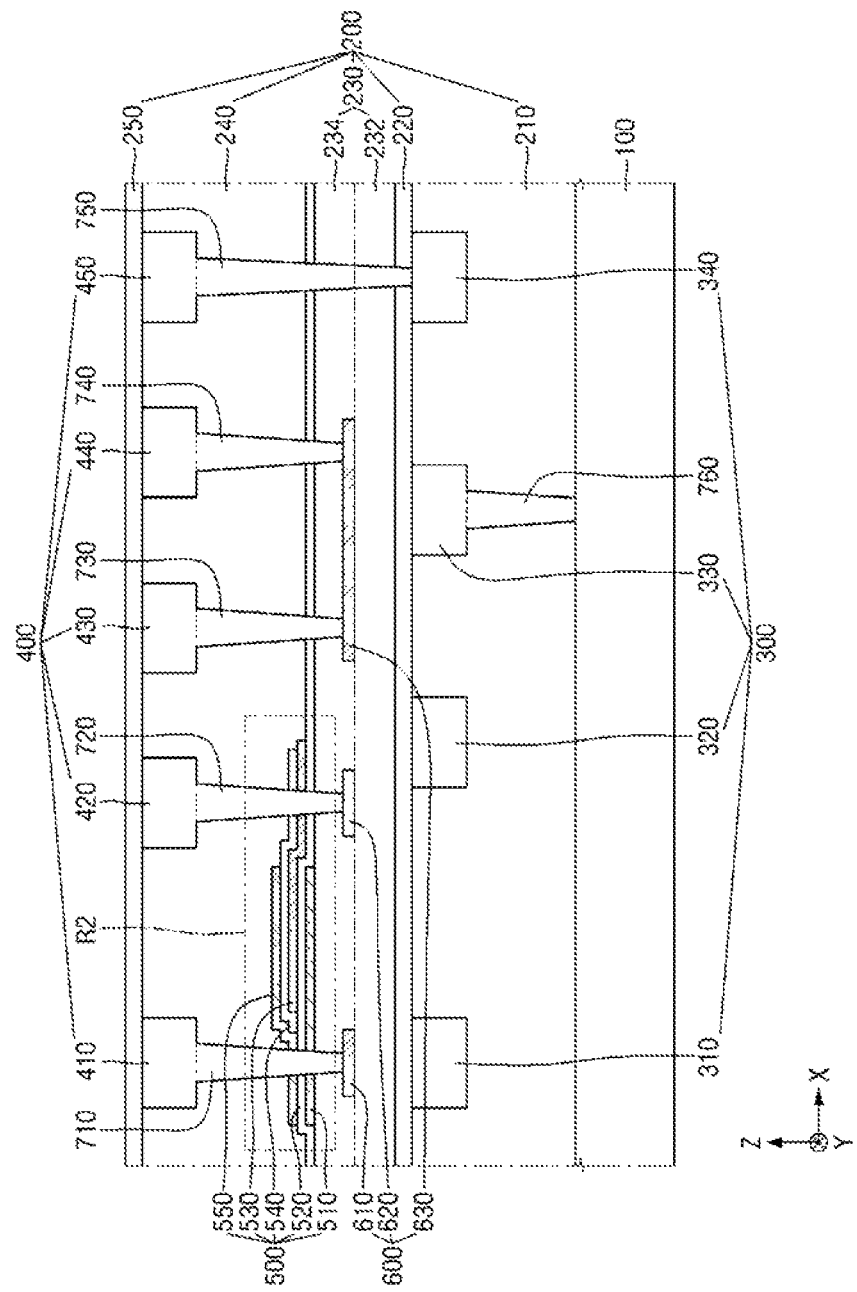
FIG. 4 is a cross-sectional view illustrating a semiconductor device according to an example embodiment of the present inventive concept.
Figure 5:
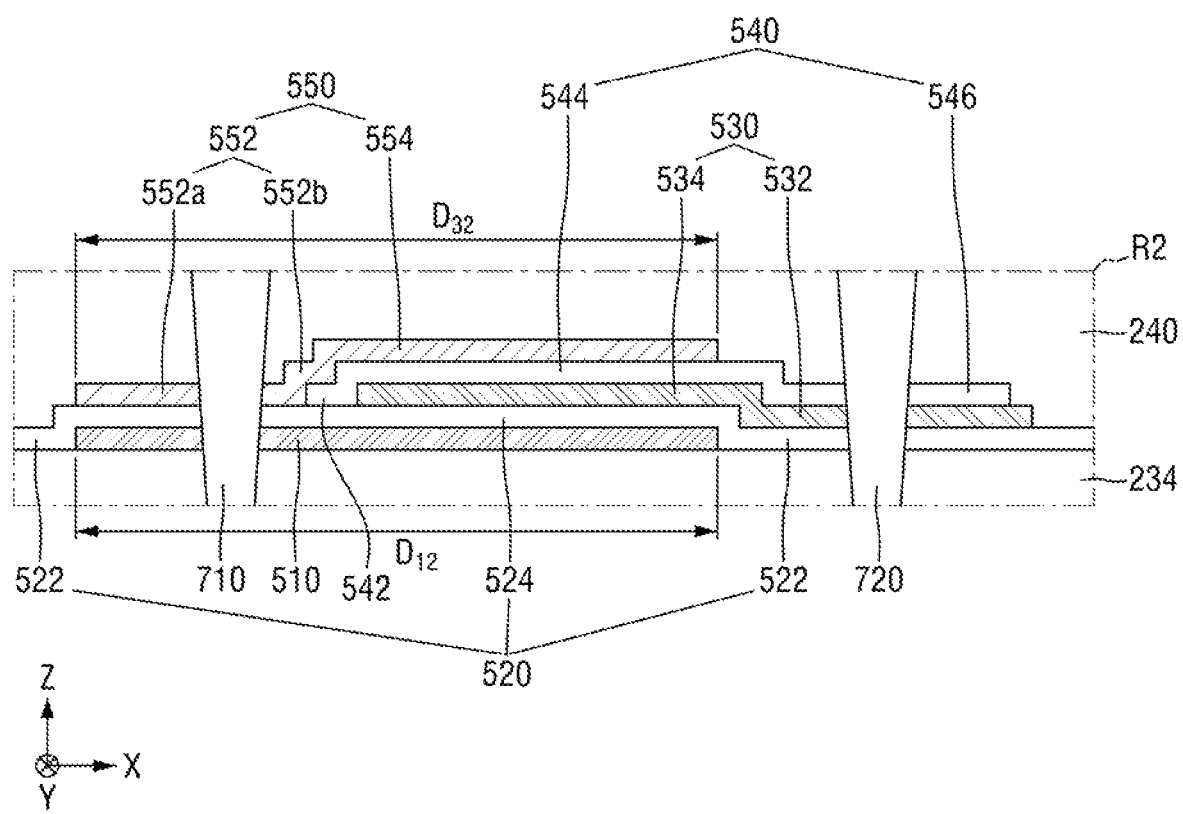
FIG. 5 is an enlarged view illustrating region R2 of FIG. 4.

FIG. 4 is a cross-sectional view illustrating a semiconductor device according to an example embodiment of the present inventive concept. FIG. 5 is an enlarged view illustrating region R2 of FIG. 4. Redundant descriptions of similar functions and elements described above with reference to FIGS. 1 to 3 will be omitted for convenience of description. Differences will be primarily described.

Referring to FIGS. 4 and 5, according to an example embodiment of the present inventive concept, a part of the second electrode pattern 530 may be covered by the fourth insulating layer 240.

For example, the second end part of the third portion 546 of the second dielectric pattern 540 might not completely cover the second end part of the first portion 532 of the second electrode pattern 530. An upper surface of the second end part of the first portion 532 of the second electrode pattern 530 and the side surface of the first portion 532 of the second electrode pattern 530 may be covered by the fourth insulating layer 240 rather than the third portion 546 of the second dielectric pattern 540 as depicted in FIG. 3.

According to example embodiments of the present inventive concept, the third electrode pattern 530 may extend along the upper surface of the first dielectric pattern 520.

For example, the first portion 552 of the third electrode pattern 550 may include a left portion 552a extended along the upper surface of the first dielectric pattern 520 (e.g., the second portion 524), and a right portion 552b extended along the upper surface of the second dielectric pattern 540.

The left portion 552a and the right portion 552b of the first portion 552 and the second portion 554 of the third electrode pattern 550 may partially overlap with one another. For example, the second end part of the left portion 552a may overlap the first end part of the right portion 552b in the third direction (e.g., the Z direction). The second end part of the right portion 552b may overlap a first end part of the second portion 554 in a first direction (e.g., the X direction).

The second portion 554 of the third electrode pattern 550 may partially overlap the second portion 534 of the second electrode pattern 530.

In FIG. 5, the length D12 of the first electrode pattern 510 is shown to be substantially equal to as the length D32 of the third electrode pattern 550. It is, however, to be understood that this is merely illustrative and the present inventive concept is not limited thereto.

Figure 6:
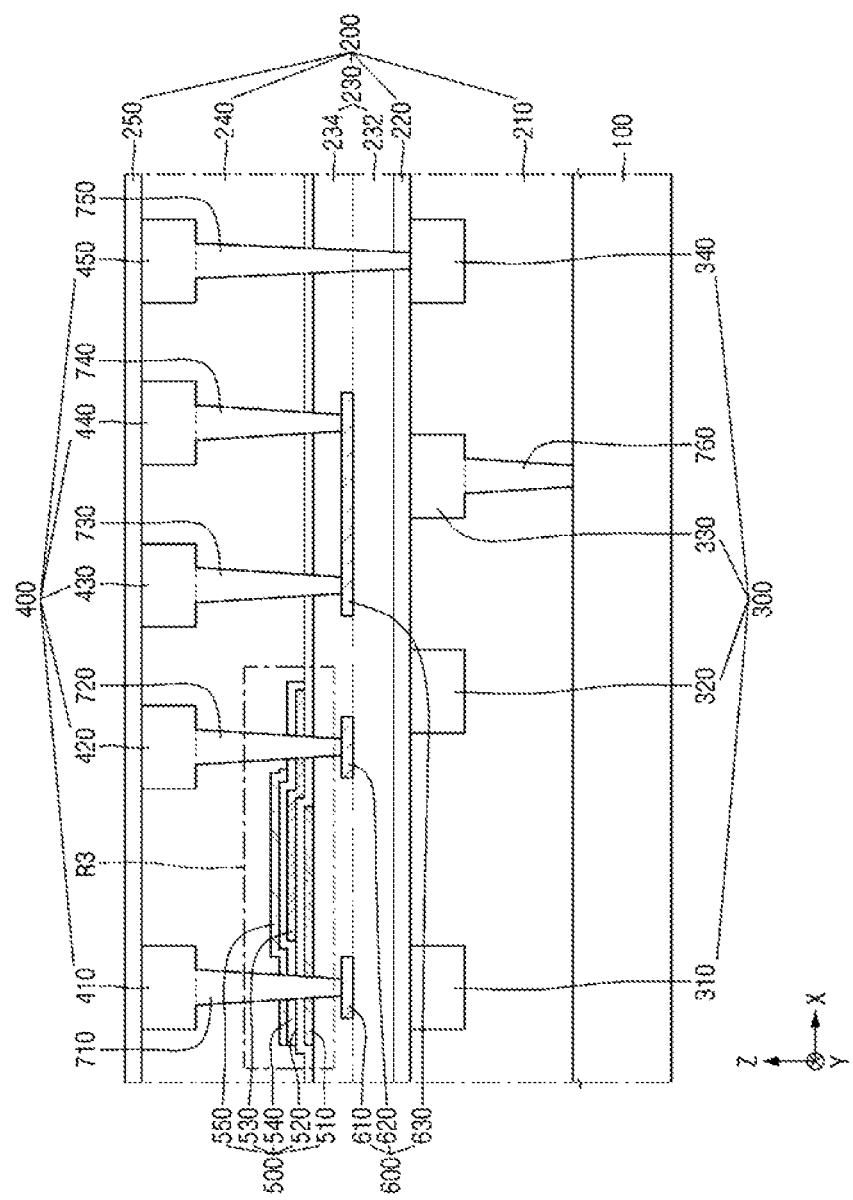
FIG. 6 is a cross-sectional view illustrating a semiconductor device according to an example embodiment of the present inventive concept.
Figure 7:
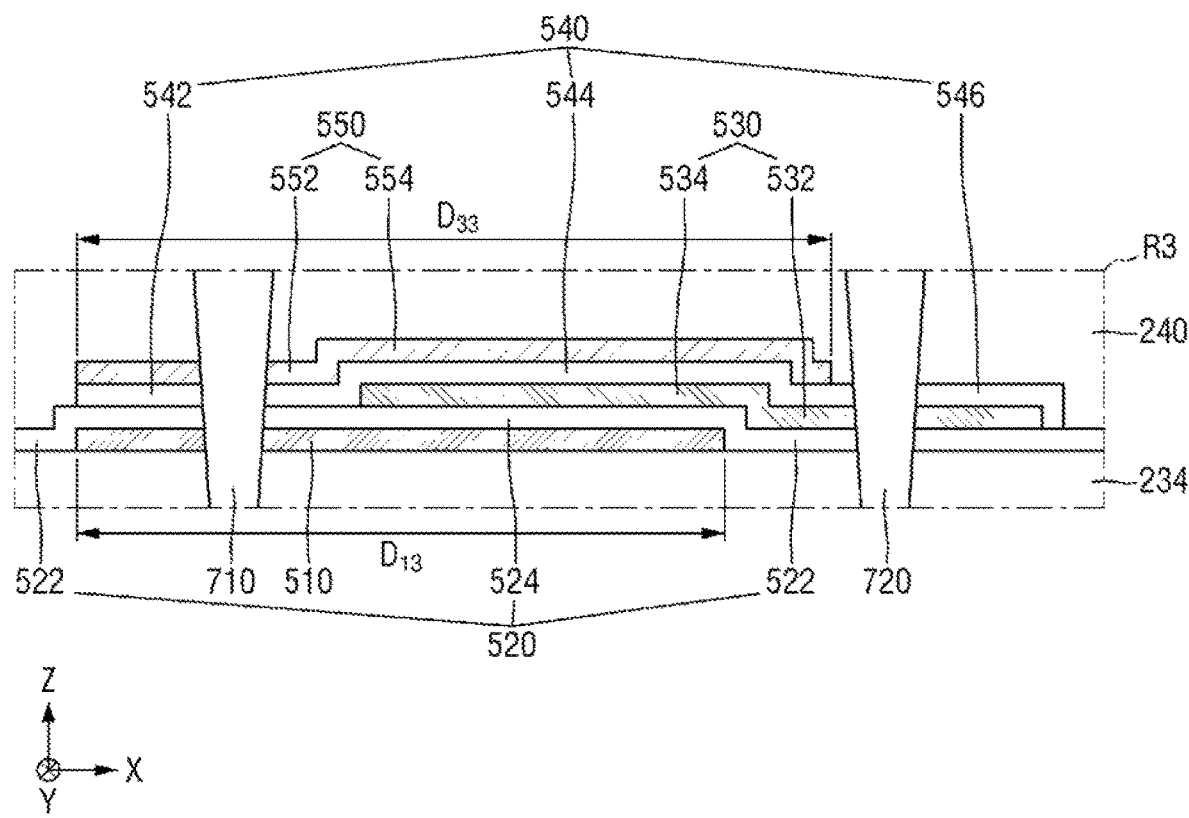
FIG. 7 is an enlarged view illustrating region R3 of FIG. 6.

FIG. 6 is a cross-sectional view illustrating a semiconductor device according to an example embodiment of the present inventive concept. FIG. 7 is an enlarged view of region R3 of FIG. 6. Redundant descriptions of similar functions and elements described above with reference to FIGS. 1 to 5 will be omitted for convenience of description.

Referring to FIGS. 6 and 7, according to example embodiments of the present inventive concept, the length D33 of the third electrode pattern 550 may be greater than the length D13 of the first electrode pattern 510.

For example, the second portion 554 of the third electrode pattern 550 may entirely cover the second portion 544 of the second dielectric pattern 540 and may extend along the third portion 546 of the second dielectric pattern 540. For example, the first portion 552 of the third electrode pattern 550 may have a first and second segment spaced apart in the first direction (e.g., the X direction) with the second portion 544 disposed therebetween, and the second segment may only partially overlap an upper surface of the third portion 546 of the second dielectric pattern 540. The second portion 554 of the third electrode pattern 550 may extend in the first direction (e.g., the X direction) beyond the underlying first electrode pattern 510. The second portion 554 of the third electrode pattern 550 might not be connected to the second via 720.

Figure 8:
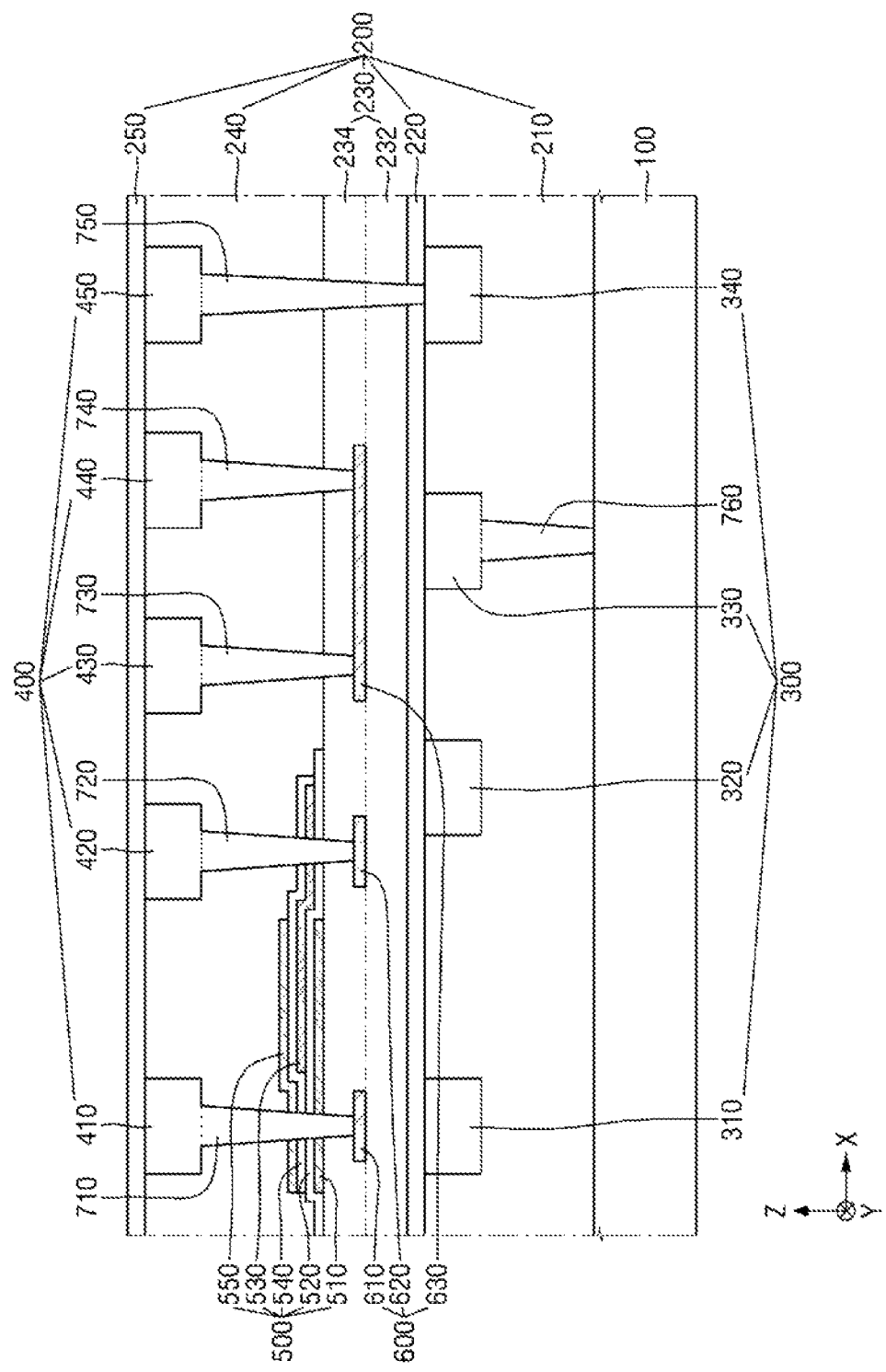
FIG. 8 is a cross-sectional view illustrating a semiconductor device according to an example embodiment of the present inventive concept.

FIG. 8 is a cross-sectional view illustrating a semiconductor device according to an example embodiment of the present inventive concept. Redundant descriptions of similar functions and elements described above with reference to FIGS. 1 to 7 will be omitted for convenience of description.

Referring to FIG. 8, according to an example embodiment of the present inventive concept, a first dielectric pattern 520 may be formed on a part of the upper surface of the upper insulating layer 234 of the third insulating layer 230. The first dielectric pattern 520 may not completely cover the upper surface of the upper insulating layer 234.

For example, the first dielectric pattern 520 may be formed between the first upper line pattern 410 and the second upper line pattern 420. The first dielectric pattern 520 may be tanned above the first etch stop pattern 610 and the second etch stop pattern 620.

In addition, the first dielectric pattern 520 might not overlap at least one of the third to fifth vias 730, 740 and 750. The first dielectric pattern 520 might not be formed above the thin-film resistor 630.

Figure 9:
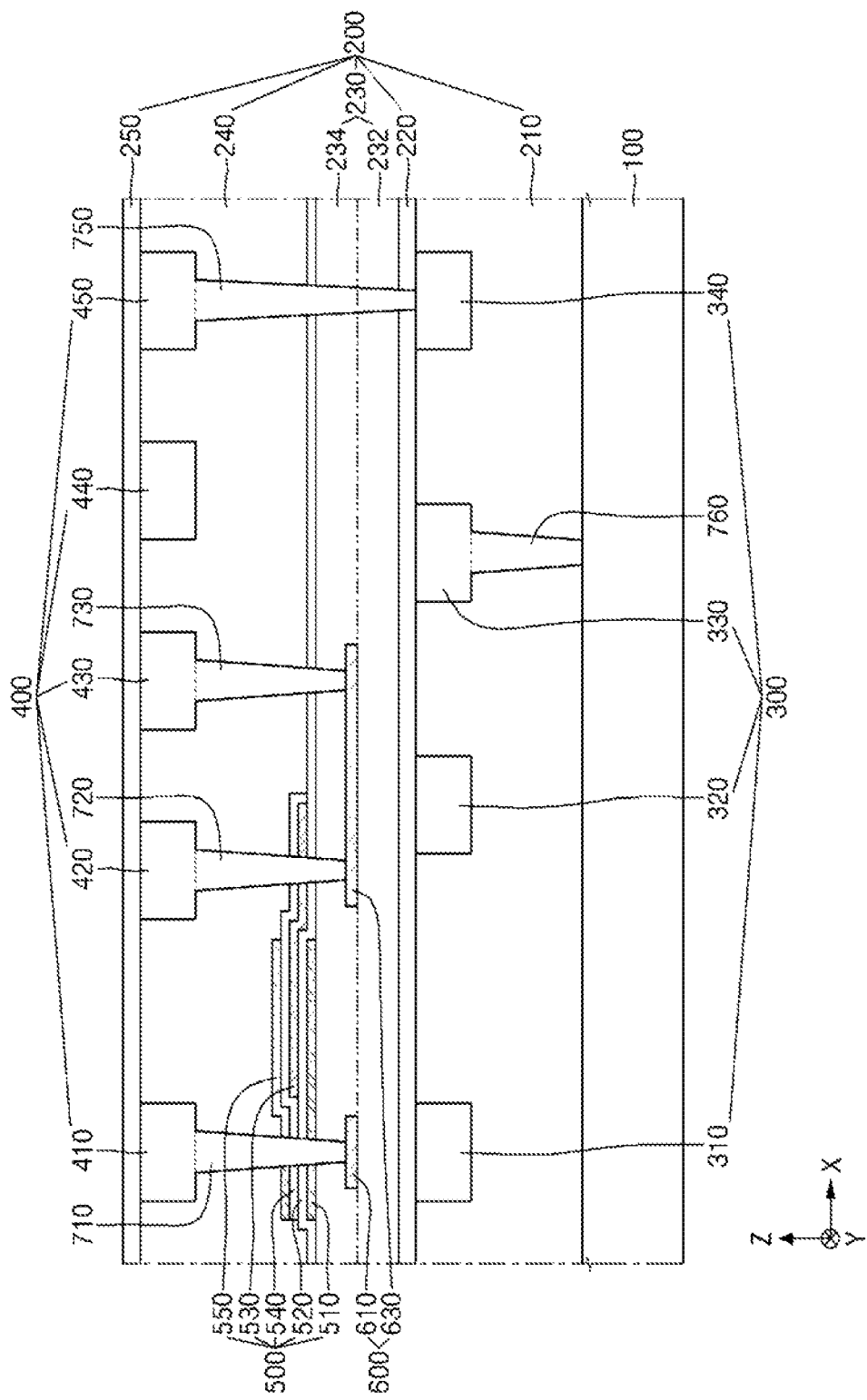
FIG. 9 is a cross-sectional view illustrating a semiconductor device according to an example embodiment of the present inventive concept.

FIG. 9 is a cross-sectional view illustrating a semiconductor device according to example embodiments of the present inventive concept. Redundant descriptions of similar functions and elements described above with reference to FIGS. 1 to 8 will be omitted for convenience of description.

Referring to FIG. 9, according to an example embodiment of the present inventive concept, the thin-film resistor 630 may connect to second and third vias 720 and 730.

For example, the second via 720 might not be connected to a second etch stop pattern 620. In this case, the semiconductor device may not include the second etch stop pattern 620.

A first via 710 may connect to the capacitor structure 500. The second via 720 may connect to the capacitor structure 500 and the thin-film resistor 630. The third via 730 may connect to the thin-film resistor 630. In other words, the first via 710 may be electrically connected to the third via 730 through the capacitor structure 500 and the thin-film resistor 630.

Figure 10:
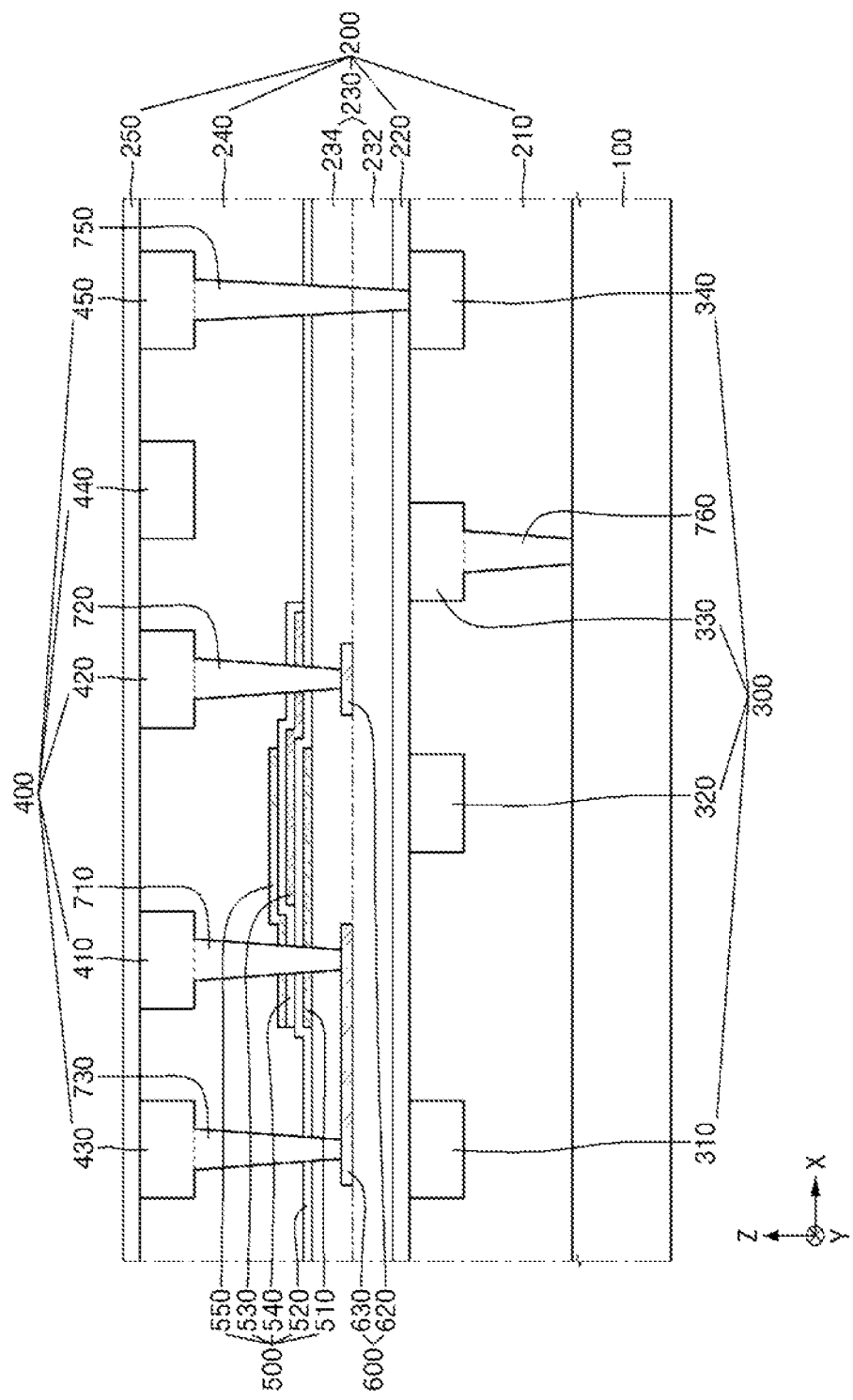
FIG. 10 is a cross-sectional view illustrating a semiconductor device according to an example embodiment of the present inventive concept.

FIG. 10 is a cross-sectional view illustrating a semiconductor device according to an example embodiment of the present inventive concept. Redundant descriptions of similar functions and elements described above with reference to FIGS. 1 to 9 will be omitted for convenience of description.

Referring to FIG. 10, according to an example embodiment of the present invention, a thin-film resistor 630 may connect to first and third vias 710 and 730.

For example, the first via 710 may not be connected to a first etch stop pattern 610. In this case, the semiconductor device may not include a first etch stop pattern 610.

The first via 710 may connect to the capacitor structure 500 and the thin-film resistor 630. A second via 720 may connect to the capacitor structure 500. The third via 730 may connect to the thin film resistor 630. That is to say, the second via 720 may be electrically connected to the third via 730 through the capacitor structure 500 and the thin-film resistor 630.

FIGS. 11 to 24 are cross-sectional views illustrating processing steps in a method for fabricating a semiconductor device according to example embodiments of the present inventive concept. Redundant descriptions of similar functions and elements described above with reference to FIGS. 1 to 10 will be omitted for convenience of description.

Figure 11:
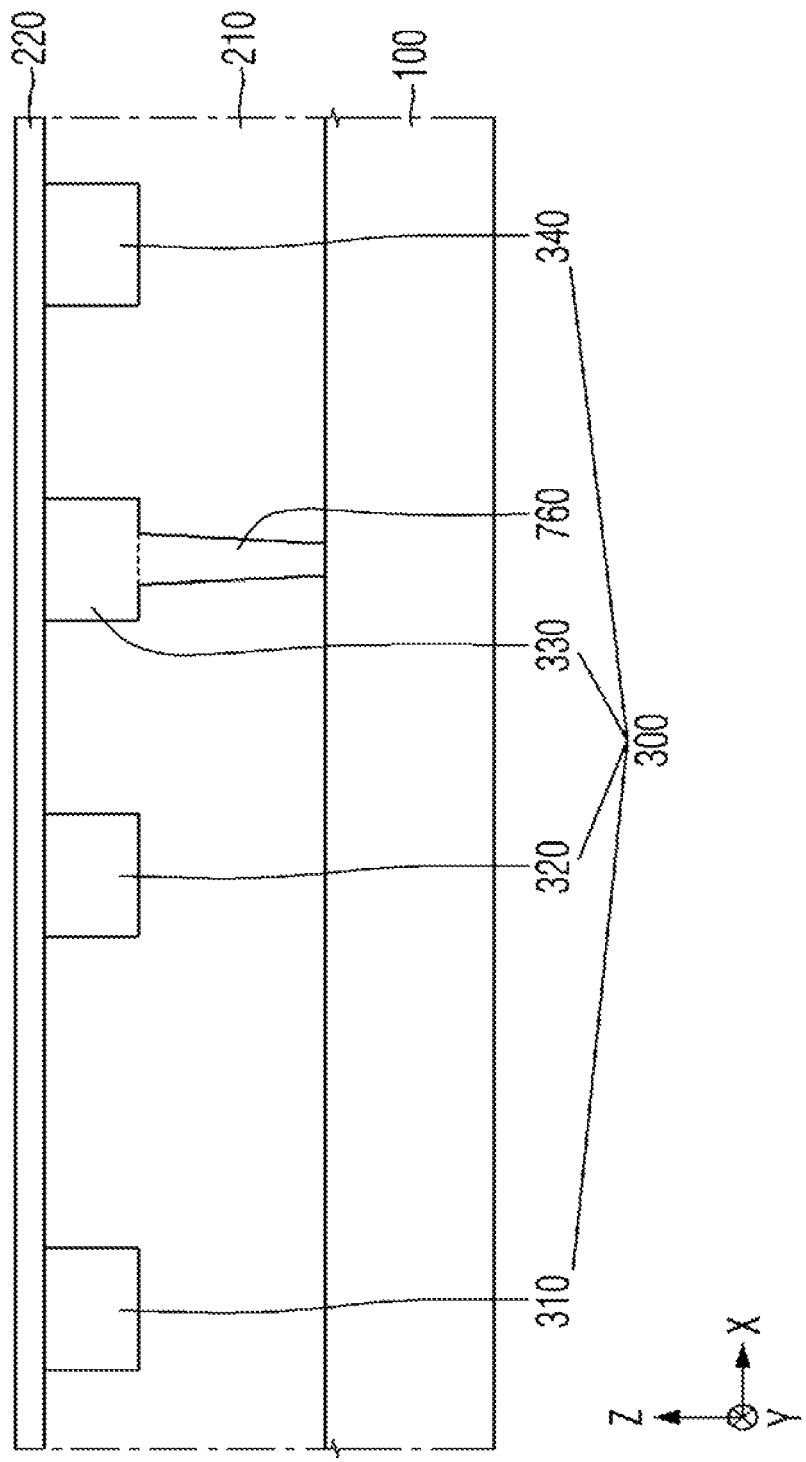
FIGS. 11 to 24 are cross-sectional vies illustrating steps in a method for fabricating a semiconductor device according to an example embodiment of the present inventive concept.

Referring to FIG. 11, a first insulating layer 210, a second insulating layer 220, a lower line structure 300 and a sixth via 760 are formed on a substrate 100.

The first insulating layer 210 may include the lower line structure 300 and the sixth via 760. For example, the lower line structure 300 and the sixth via 760 may be formed by etching corresponding parts of the first insulating layer 210.

The first to fourth lower lines 310, 320, 330 and 340 of the lower line structure 300 may be spaced apart from one another.

The sixth via 760 may connect to the third lower line pattern 330. The sixth via 760 may connect to the substrate 100 through the first insulating layer 210. That is to say, the sixth via 760 may be electrically connected to the third lower line pattern 330 and the substrate 100.

A second insulating, layer 220 may be formed on the first insulating layer 210. The second insulating layer 220 may be formed along the upper surface of the first insulating layer 210 and the upper surface of the lower line structure 300. In other words, the second insulating layer 220 may be used as a capping layer of the lower line structure 300.

Figure 12:
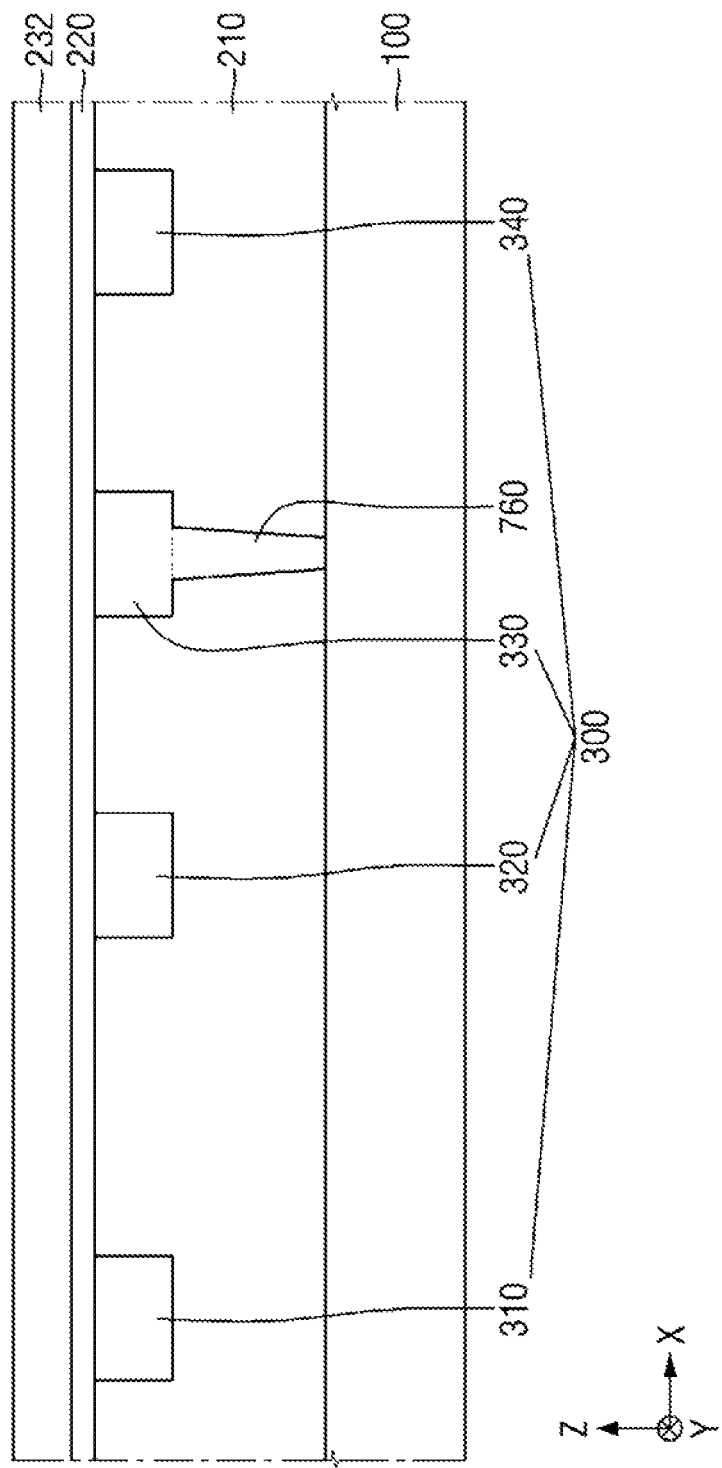

Referring to FIG. 12, a lower insulating layer 232 of a third insulating layer 230 may be formed on the second insulating layer 220.

Although the lower insulating layer 232 is shown as conforming to the second insulating layer 220 in FIG. 2, this is merely illustrative. For example, the lower insulating layer 232 may not conform to the second insulating layer 220. The lower insulating layer 232 may include a first portion and a second portion that have different thicknesses.

The lower insulating layer 232 may be formed via a deposition process. For example, the lower insulating layer 232 may be deposited by a physical vapor deposition (PVD) technique and/or a chemical vapor deposition (CVD) technique.

Figure 13:
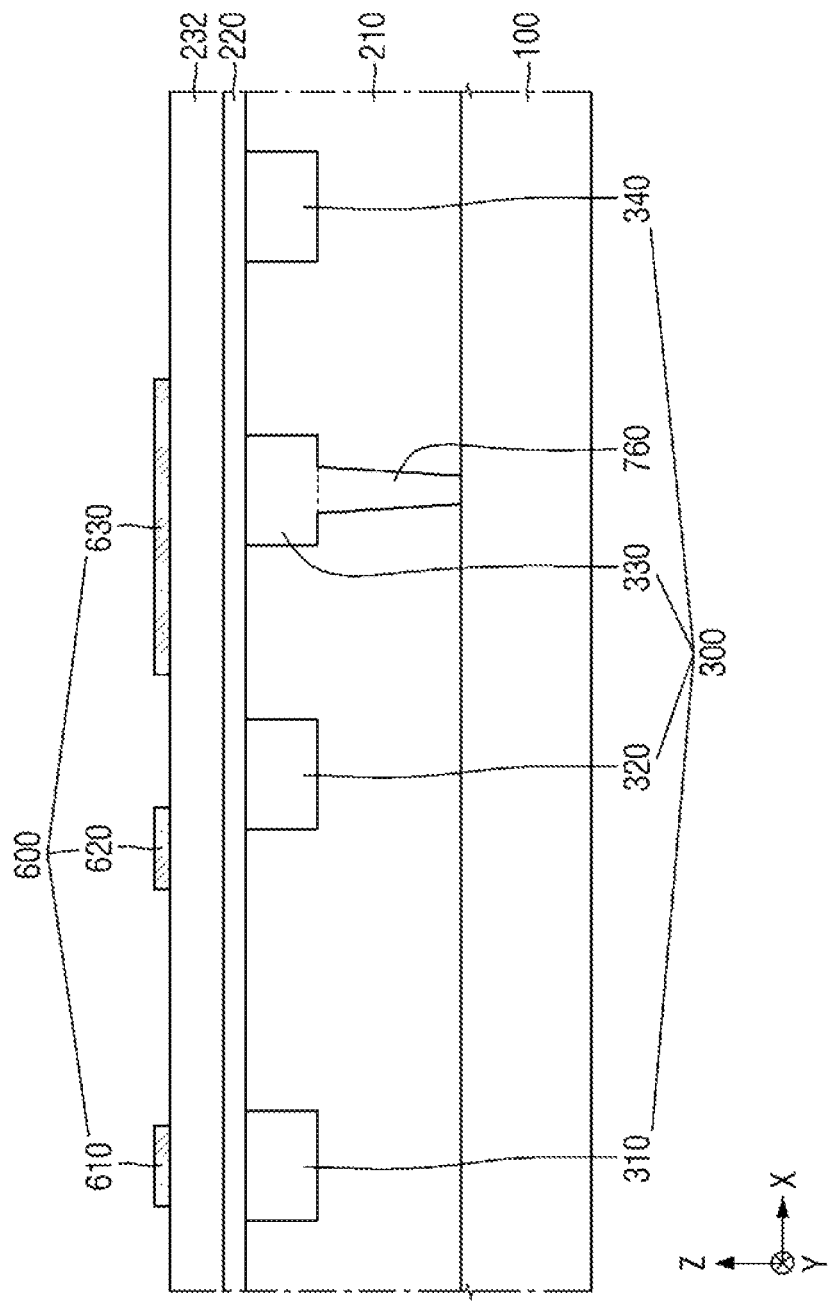

Referring to FIG. 13, conductive patterns 600 may be formed on the lower insulating layer 232 of the third insulating layer 230. For example, a first etch stop pattern 610, a second etch stop pattern 620 and a thin-film resistor 630 may be formed on the lower insulating layer 232.

The conductive patterns 600 may be formed via a deposition process and an etching process. For example, a conductive layer may be formed on substantially the entire lower insulating layer 232 via a deposition process. Then, an etching process may be carried out on the conductive layer, to form the first etch stop pattern 610, the second etch stop pattern 620 and the thin-film resistor 630 of the conductive patterns 600.

The conductive patterns 600 may be formed simultaneously via a single etching process. For example, the first etch stop pattern 610, the second etch stop pattern 620 and the thin film resistor 630 may be formed simultaneously via a single etching process.

Alternatively, the conductive patterns 600 may be formed entirely via a deposition process. For example, a mask pattern may be formed above the lower insulating layer 232 to expose a part of the lower insulating layer 232. Then, a material of a conductive patterns 600 may be deposited on the mask pattern. Subsequently, the mask pattern is removed, such that the individual conductive patterns 600 are formed.

Although the conductive patterns 600 are shown as being formed at the same level in FIG. 13, the present inventive concept is not limited thereto. For example, the lower insulating layer 232 may include a first portion and a second portion that have different thicknesses in the third direction (e.g., the Z direction). In addition, some of the conductive patterns 600 (e.g., the first and second etch stop patterns 610 and 620) may be formed in the first portion of the lower insulating layer 232. The others of the conductive patterns 600 (e.g., the thin-film resistor 630) may be formed in the second portion of the lower insulating layer 232.

Figure 14:
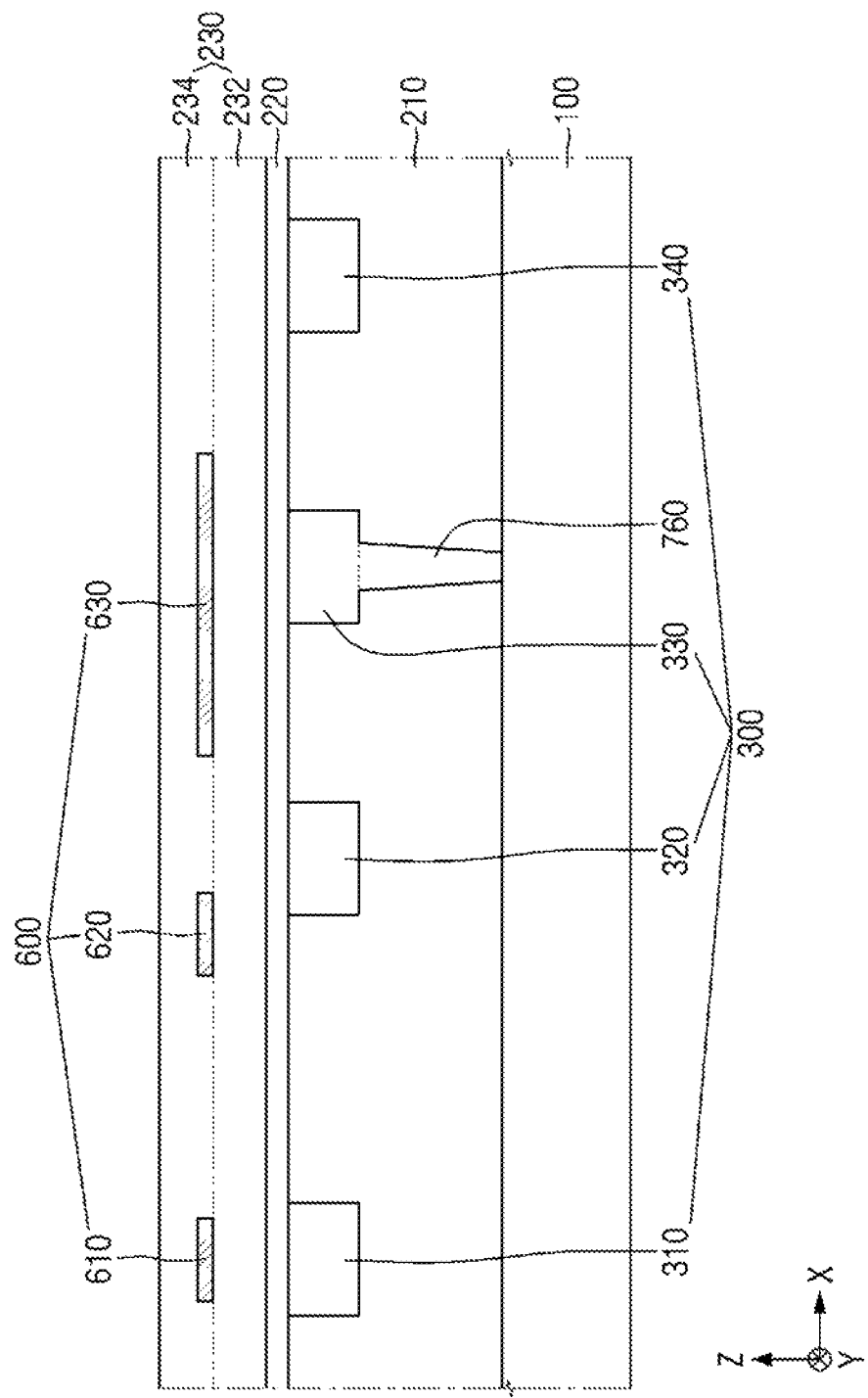

Referring to FIG. 14, an upper insulating layer 234 of the third insulating layer 230 is formed on the lower insulating layer 232 of the third insulating layer 230 and the conductive patterns 600. For example, the upper insulating layer 234 may be formed along the upper surface of the lower insulating layer 232 and the upper surfaces of the first etch stop pattern 610, the second etch stop pattern 620 and/or the thin film resistor 630.

The upper insulating layer 234 may be formed along the lower insulating layer 232 with a constant thickness in the third direction (e.g., the Z direction). For example, the upper surface of the upper insulating layer 234 may be planarized via a chemical mechanical polishing (CMP) process.

The upper insulating layer 234 may be formed via a deposition process. For example, the upper insulating layer 234 may be deposited by a physical vapor deposition (PVD) technique and/or a chemical vapor deposition (CVD) technique.

Figure 15:
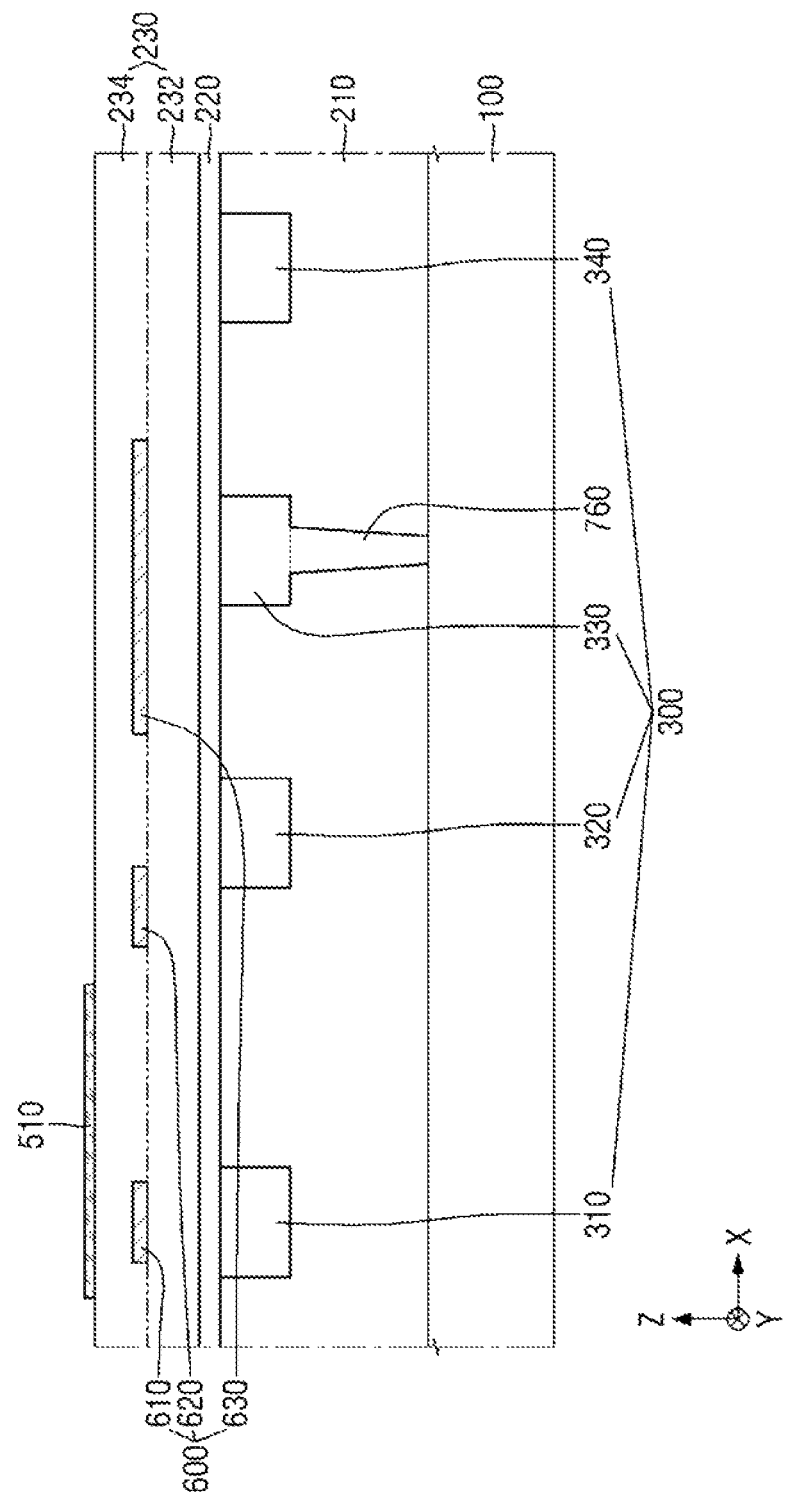

Referring to FIG. 15, a first electrode pattern 510 may be formed on the third insulating layer 230.

The first electrode pattern 510 may be formed along the upper surface of the third insulating layer 230 with a constant thickness. For example, the first electrode pattern 510 may be formed via a deposition process and an etching process. According to an example embodiment of the present inventive concept, the first electrode pattern 510 may be formed via a deposition process using a mask pattern.

Figure 16:
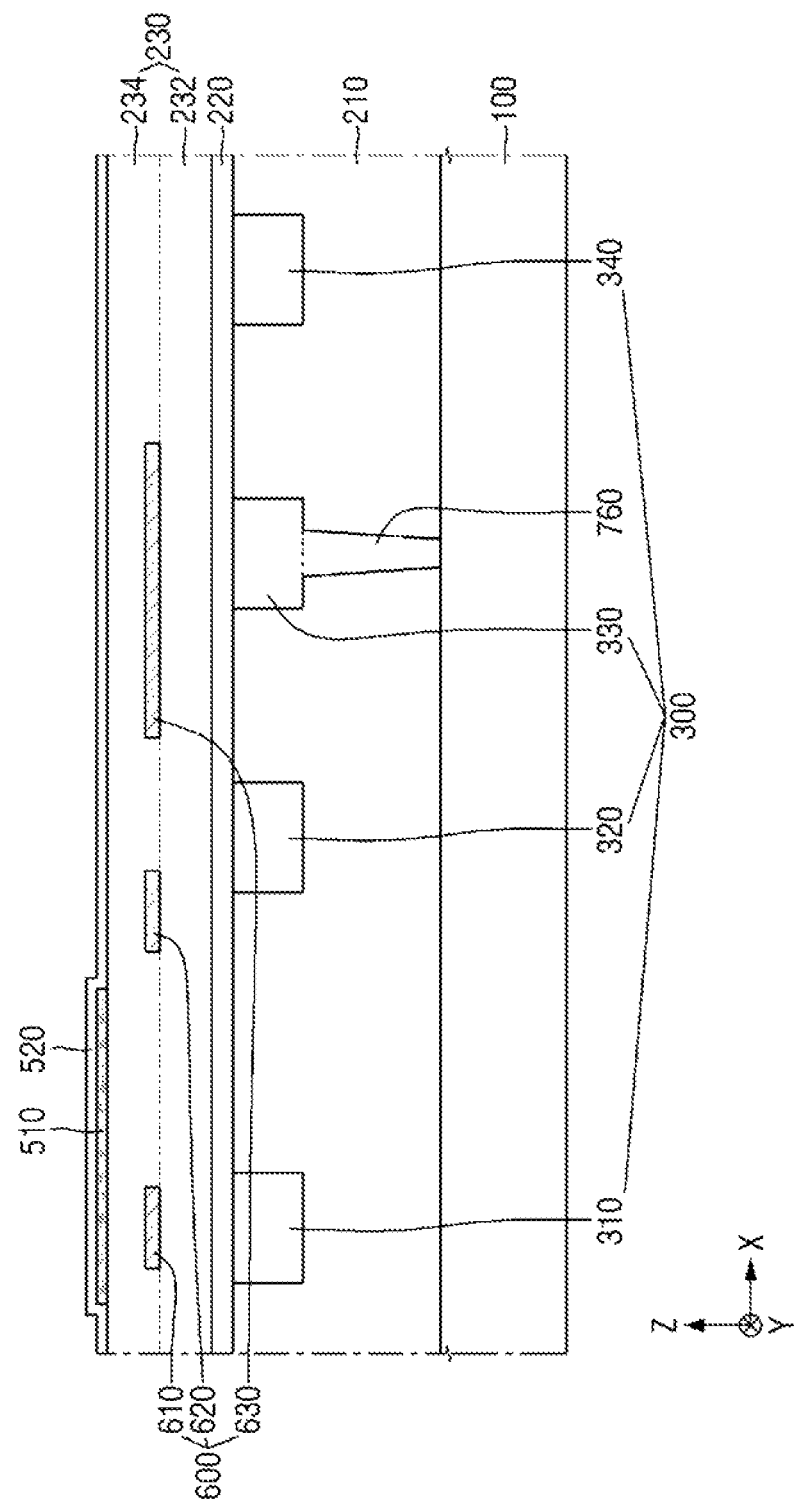

Referring to FIG. 16, a first dielectric pattern 520 may be formed over the first electrode pattern 510.

The first dielectric pattern 520 may be formed along the upper surface of the third insulating layer 230. The first dielectric pattern 520 may cover the side surfaces and the upper surface of the first electrode pattern 510. The first dielectric pattern 520 may be formed along the upper surface of the third insulating layer 230.

Although the first dielectric pattern 520 is shown as being formed on the entire upper surface of the third insulating layer 230, the present inventive concept is not limited thereto. For example, the first dielectric pattern 520 may be formed so that it covers only a part of the upper surface of the third insulating layer 230.

Figure 17:
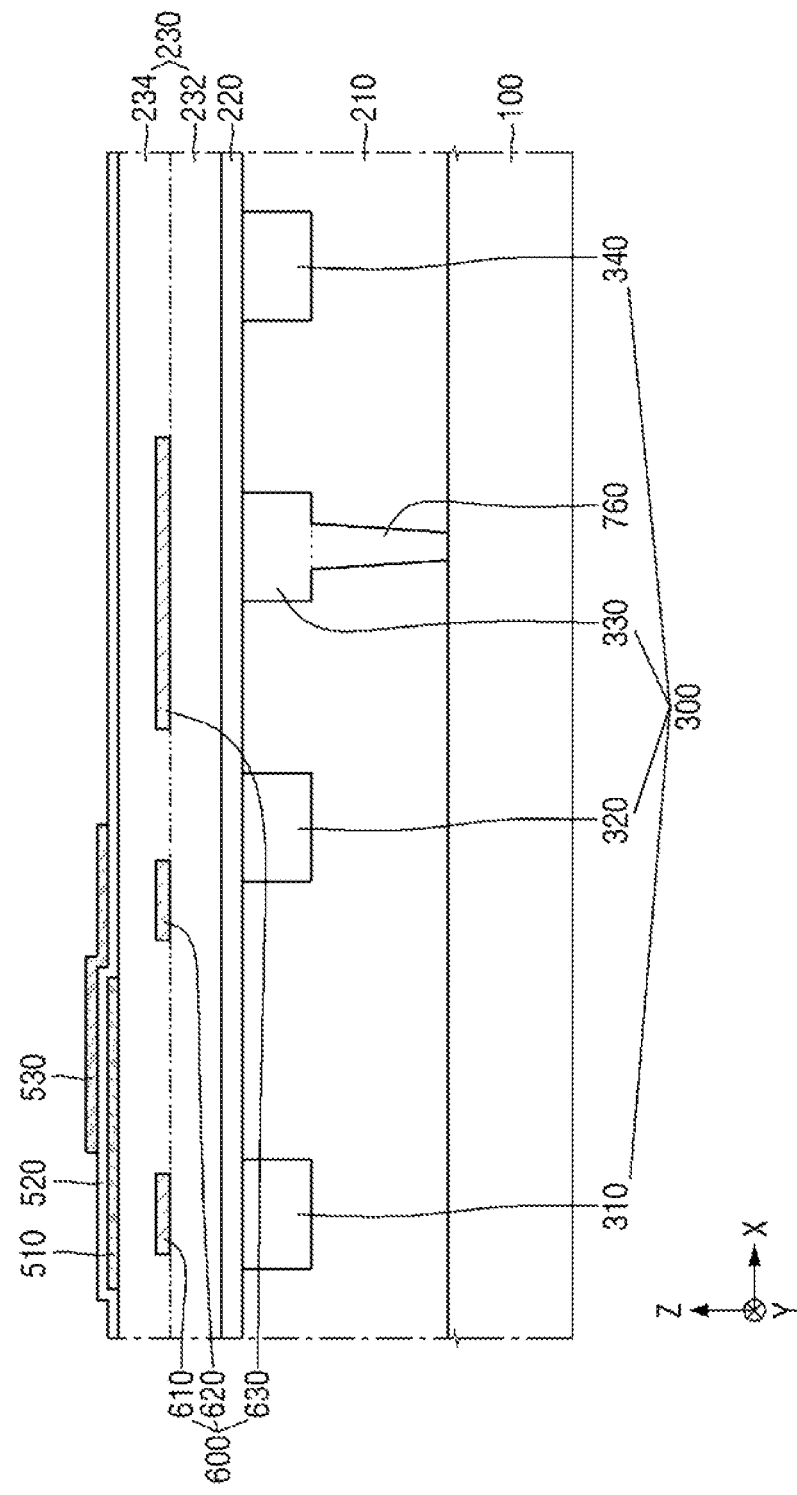

Referring to FIG. 17, a second electrode pattern 520 is formed on the first dielectric pattern 520.

The second electrode pattern 530 may be formed along at least a part of the upper surface of the first dielectric pattern 520. The second electrode pattern 530 may be formed such that it overlaps with at least a part of the first electrode pattern 510. In other words, a part of the second electrode pattern 530 may overlap a part of the first electrode pattern 510 in the direction perpendicular to the upper surface of the substrate 100 (e.g., the Z direction).

Figure 18:
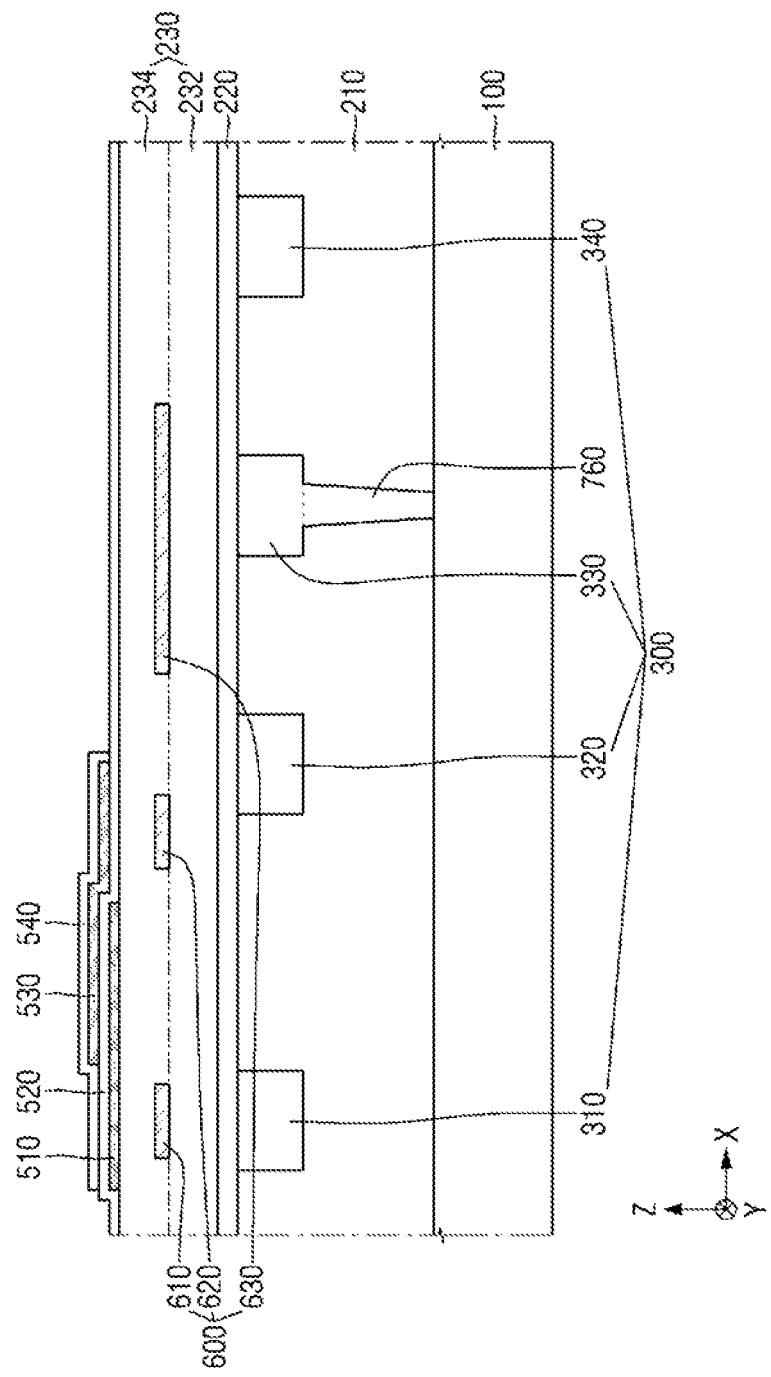

Referring to FIG. 18, a second dielectric pattern 540 may be formed over the first dielectric pattern 520 and the second electrode pattern 530.

The second dielectric pattern 540 may be formed along the upper surface of the first dielectric pattern 520 and the upper surface of the second electrode pattern 530. The second dielectric pattern 540 may cover the side surfaces and the upper surface of the second electrode pattern 530.

Figure 19:
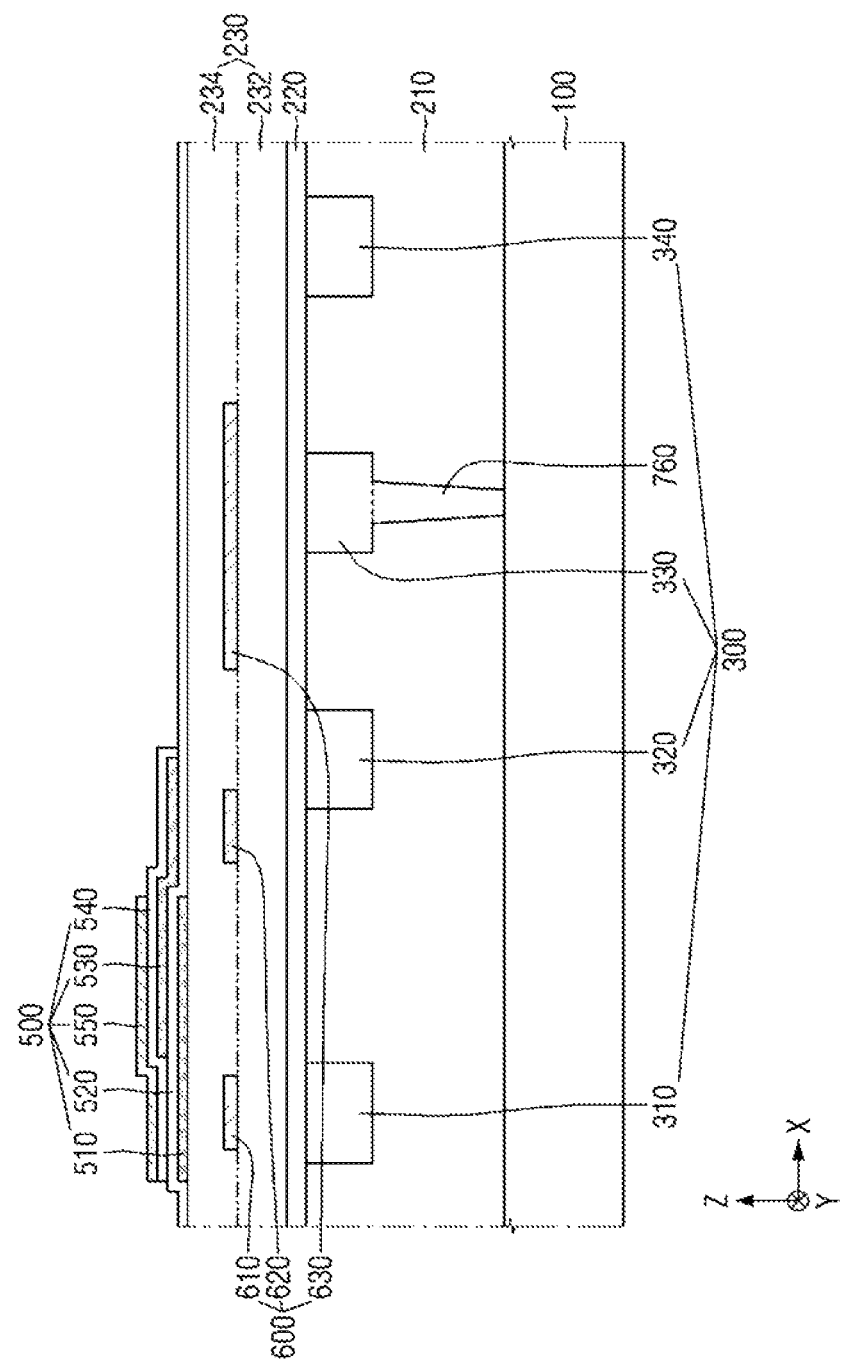

Referring to FIG. 19, a third electrode pattern 550 may be formed on the second dielectric pattern 540.

The third electrode pattern 550 may be formed along the upper surface of the second dielectric pattern 520. The third electrode pattern 550 may be formed such that it overlaps with a part of the second electrode pattern 530. In other words, a part of the third electrode pattern 550 may overlap a part of the second electrode pattern 530 in the direction perpendicular to the upper surface of the substrate 100 (e.g., the Z direction).

Figure 20:
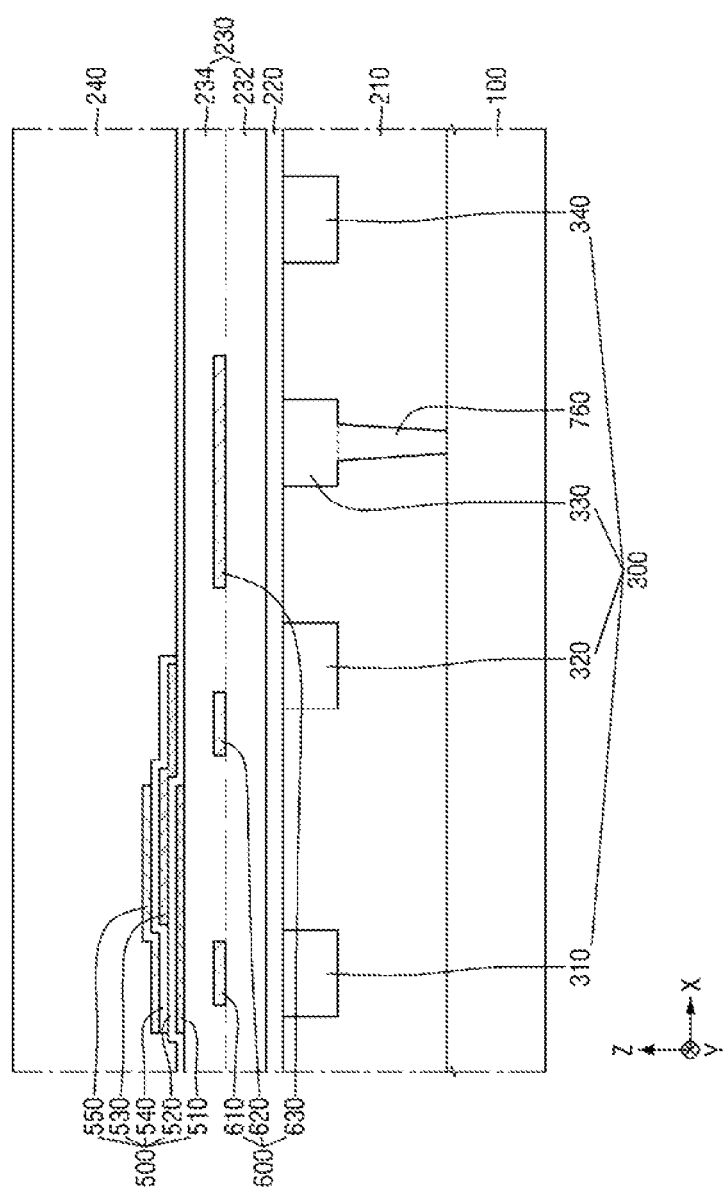

Referring to FIG. 20, a fourth insulating layer 240 may be formed over the capacitor structure 500. For example, the fourth insulating layer 240 may be formed along the upper surfaces of the first dielectric pattern 520, the second dielectric pattern 540, and the third electrode pattern 550.

The fourth insulating layer 240 may have a flat upper surface. For example, the upper surface of the fourth insulating layer 240 may be planarized via a CMP process.

Figure 21:
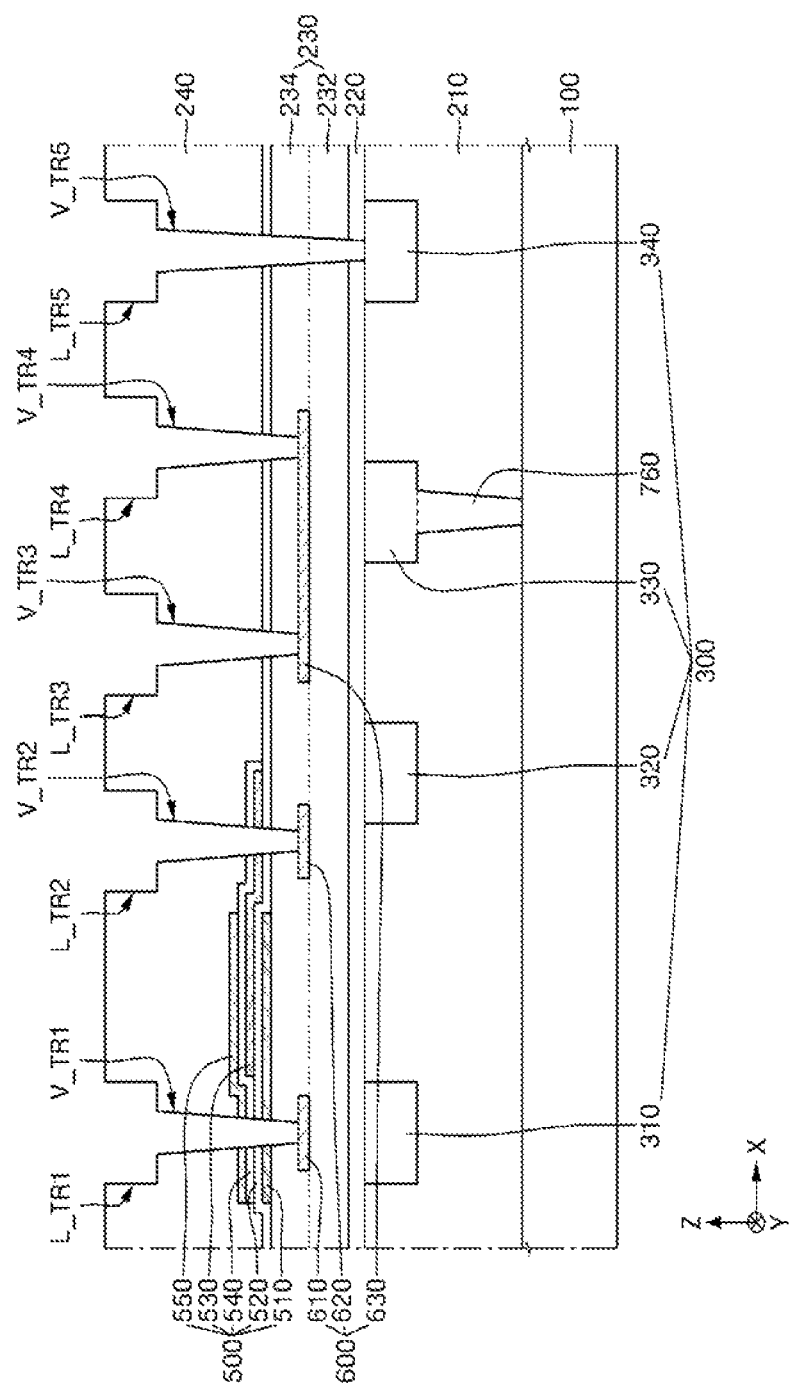

Referring to FIG. 21, first to fourth trenches V_TR1, V_TR2, V_TR3, V_TR4 and V_TR5 are formed through the second to fourth insulation layers 220, 230 and 240 and the conductive patterns 600. In, addition, first to fifth line trenches L_TR1, L_TR2, L_TR3, L_TR4 and L_TR5 may be formed in the fourth insulating layer 240.

The first and second via trenches V_TR1 and V_TR2 may be formed by etching a part of the fourth insulating layer 240, the capacitor structure 500 and the upper insulating layer 234 of the third insulating layer 230. The first and second etch stop patterns 610 and 620 may be used as an etch stop layer.

The third and fourth via trenches V_TR1 and V_TR2 may be formed by etching a part of the fourth insulating layer 240 and the upper insulating layer 234 of the third insulating layer 230. The thin-film resistor 630 may also be used as an etch stop layer.

A part of the second insulating layer 220, the third insulating layer 230 and the fourth insulating layer 240 may be etched to form the fifth via trench V_TR5. The fourth lower line pattern 340 of the lower line structure 300 may be used as an etch stop layer.

The first to fifth line trenches L_TR1, L_TR2, L_TR3, L_TR4 and L_TR5 may be formed by removing a part of the upper surface of the fourth insulating layer 240.

The first to fifth via trenches V_TR1, V_TR2, V_TR3, V_TR4 and V_TR5 and the first to fifth line trenches L_TR1, L_TR2, L_TR3, L_TR4 and L_TR5 may be formed, for example, via a photolithography process. For example, an etching process using a mask pattern as an etching mask may be performed.

The first to fifth via trenches V_TR1, V_TR2, V_TR3, V_TR4 and V_TR5 and the first to fifth line trenches L_TR1, L_TR2, L_TR3, L_TR4 and L_TR5 may be formed via a single process.

Alternatively, the first to fifth via trenches V_TR1, V_TR2, V_TR3, V_TR4 and V_TR5 and the first to fifth line trenches L_TR1, L_TR2, L_TR3, L_TR4 and L_TR5 may be formed via different processes.

Figure 22:
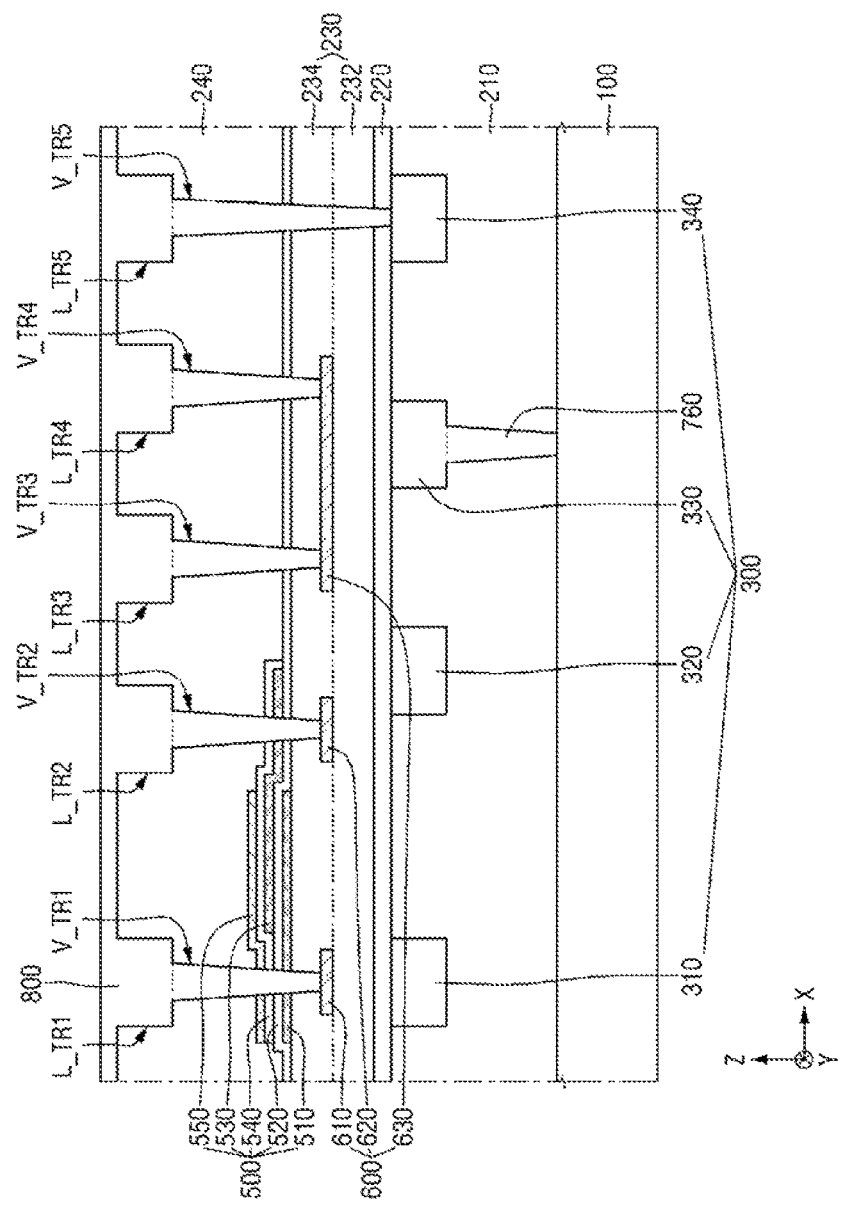

Referring to FIG. 22, the spaces in the first to fifth via trenches V_TR1, V_TR2, V_TR3, V_TR4 and V_TR5 and the first to fifth line trenches L_TR1, L_TR2, L_TR3, L_TR4 and L_TR5 are completely filled with a conductive material 800.

For example, the conductive material 800 may be formed in the spaces inside the first to fifth via trenches V_TR1, V_TR2, V_TR3, V_TR4 and V_TR5 and the first to fifth line trenches L_TR1, L_TR2, L_TR3, L_TR4 and L_TR5 and the upper surface of the fourth insulating layer 240.

For example, the conductive material 800 may include a metal such as W, Ti, Ta, Cu, Al and nickel (Ni).

Figure 23:
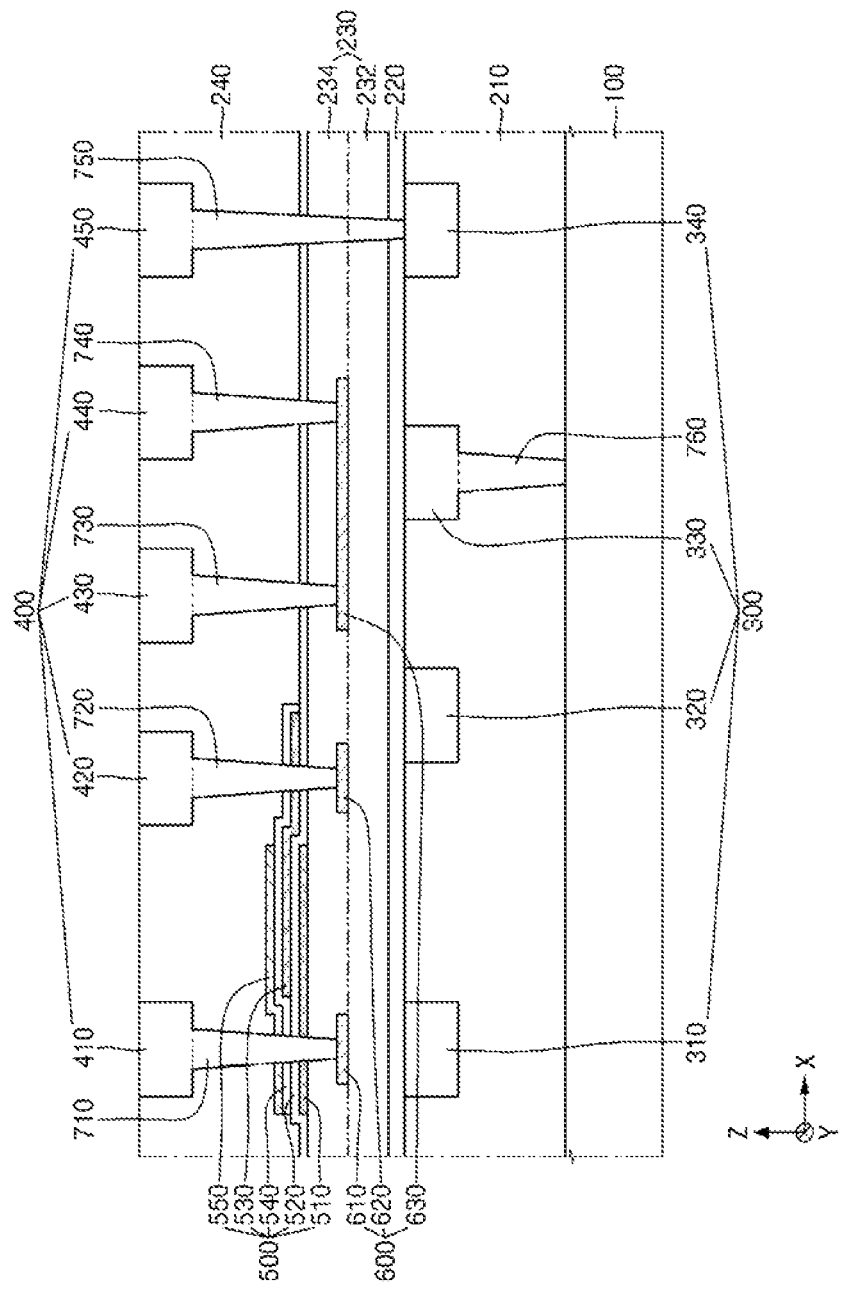

Referring to FIG. 23, the first to fifth vias 750 and first to fifth upper line patterns 450 may be formed.

The conductive material 800 formed on the fourth insulating layer 240 may be selectively removed via a CMP process. The first to fifth upper line patterns 450 may be electrically separated from one another.

Figure 24:
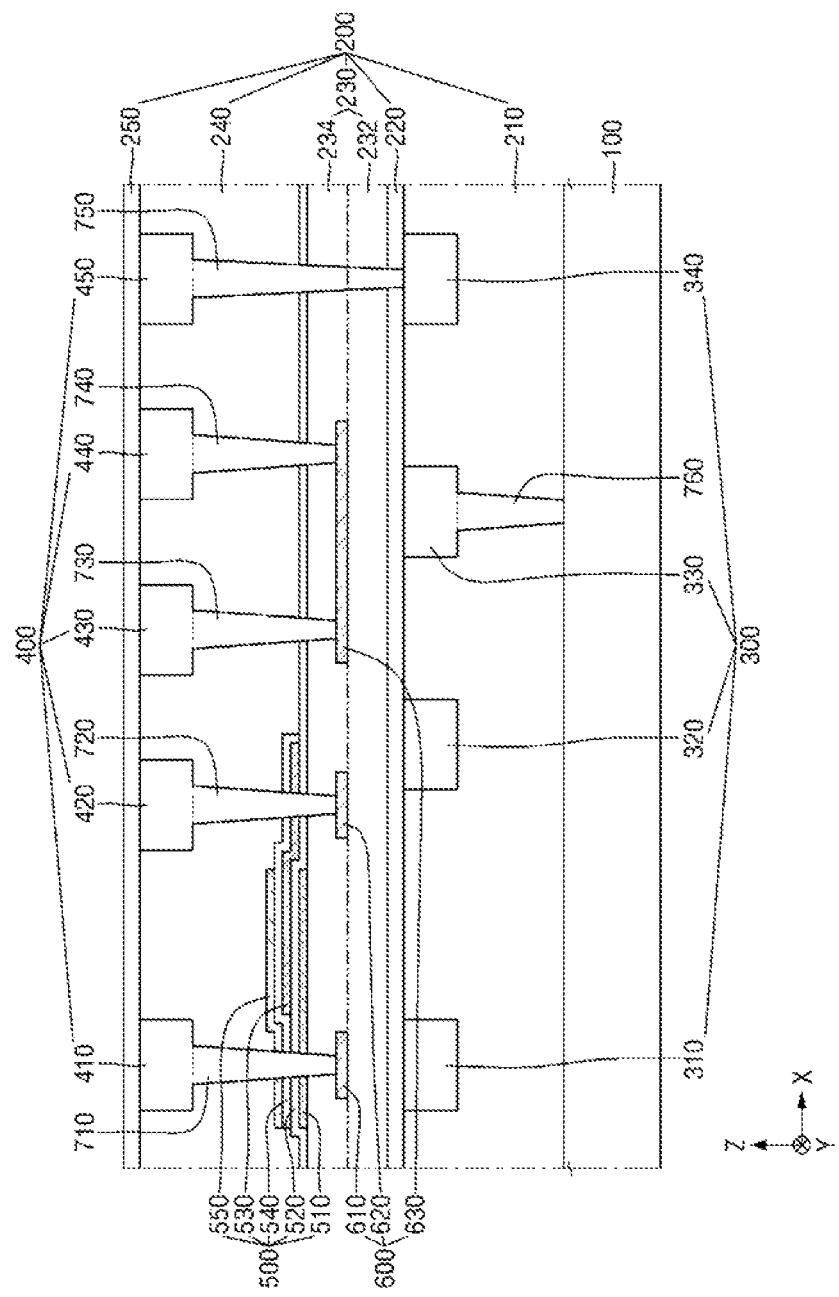

Referring to FIG. 24, a filth insulating layer 250 may be formed on the upper line structure 400 and the fourth insulating layer 240.

For example, the fifth insulating layer 250 may be formed along the upper surface of the fourth insulating layer 240 and the upper surface of the upper line structure 400. The fifth insulating layer 250 may cover the upper surface of the upper line structure 400. The fifth insulating layer 250 may be used as a capping layer for the upper line structure 400.

While the example embodiments of the present inventive concept have been shown and described above, it will be understood by one of ordinary skill in the art that modifications and variations in form and detail may be made therein without departing from the spirit and scope of the present inventive concept.

What is claimed is:

1. A semiconductor device comprising:
a substrate;
a first insulating layer disposed on the substrate;
a thin-film resistor disposed in the first insulating layer;
a capacitor structure disposed on the first insulating layer and comprising a first electrode pattern, a first dielectric pattern, a second electrode pattern, a second dielectric pattern and a third electrode pattern sequentially stacked;
a first via connected to the first electrode pattern and the third electrode pattern, a part of the first via being disposed in the first insulating layer;
a second via connected to the second electrode pattern;
a third via connected to the thin-film resistor; and
a fourth via electrically connected to the thin-film resistor,
wherein the first insulating layer comprises a first etch stop pattern and a second etch stop pattern spaced apart from the first etch stop pattern, which are formed at a same level as the thin-film resistor,
wherein the first via is connected to the first etch stop pattern,
wherein the second via is connected to the second etch stop pattern,
wherein the capacitor structure is formed at a higher level than the thin-film resistor, based on an upper surface of the substrate.

2. The semiconductor device of claim 1,
wherein a part of the first electrode pattern and a part of the third electrode pattern overlap with a part of the second electrode pattern in a direction perpendicular to an upper surface of the substrate.

3. The semiconductor device of claim 1,
wherein the first dielectric pattern is disposed on an upper surface of the first electrode pattern and an upper surface of the first insulating layer,
wherein the second electrode pattern is disposed on an upper surface of the first dielectric pattern,
wherein the second dielectric pattern is disposed on the upper surface of the first dielectric pattern and an upper surface of the second electrode pattern, and
wherein the third electrode pattern is disposed on an upper surface of the second dielectric pattern.

4. The semiconductor device of claim 1,
wherein the first etch stop pattern and/or the second etch stop pattern comprises a conductive material.

5. The semiconductor device of claim 1, further comprising:
a first line pattern disposed between the substrate and the first insulating layer,
wherein the first to third vias are not electrically connected to the first line pattern.

6. The semiconductor device of claim 5, further comprising:
a fourth via connected to the first line pattern and penetrating the first insulating layer.

7. The semiconductor device of claim 6,
wherein an upper surface of the fourth via extends upwardly from an upper surface of the first line pattern.

8. The semiconductor device of claim 1, further comprising:
a second insulating layer disposed over the capacitor structure,
wherein the first to third vias at least partially penetrate the second insulating layer.

9. The semiconductor device of claim 8, further comprising:
a second line pattern disposed in the second insulating layer,
wherein the second line pattern is connected to at least one of the first to third vias.

* * * * *